(12) United States Patent  (10) Patent No.: US 6,404,115 B1
Sanderson  (45) Date of Patent: Jun. 11, 2002

(54) PARTICLE BEAM EMITTING ASSEMBLY

(75) Inventor: Allan Sanderson, Cambridgeshire (GB)

(73) Assignee: The Welding Institute, Cambridge (GB)

( * ) Notice: Subject to any disclaimer, the term of this patent is extended or adjusted under 35 U.S.C. 154(b) by 0 days.

(21) Appl. No.: 09/508,914

(22) PCT Filed: Sep. 24, 1998

(86) PCT No.: PCT/GB98/02882

§ 371 (c)(1),
(2), (4) Date: Jun. 13, 2000

(87) PCT Pub. No.: WO99/16101

PCT Pub. Date: Apr. 1, 1999

(30) Foreign Application Priority Data

Sep. 24, 1997 (GB) .............................. 9720350

(51) Int. Cl.[7] .................................. H01J 1/02
(52) U.S. Cl. ................. 313/359.1; 313/310; 313/341
(58) Field of Search .................. 313/359.1, 362.1, 313/412, 413, 306, 310, 341

(56) References Cited

U.S. PATENT DOCUMENTS

| 3,612,942 A | 10/1971 | Peyrot ..................... 313/341 |
| 4,041,316 A | 8/1977 | Todokoro et al. ....... 250/396 R |
| 4,333,214 A | 6/1982 | Neumann et al. ............... 29/80 |
| 4,396,566 A | 8/1983 | Brinkmann et al. .......... 264/70 |
| 5,623,183 A | 4/1997 | Allen et al. ................. 315/5.37 |
| 5,661,369 A | 8/1997 | Sanderson .................. 315/105 |

FOREIGN PATENT DOCUMENTS

| DE | 3227974 A1 | 2/1984 |
| EP | 0295616 A | 12/1988 |
| EP | 0523699 A1 | 1/1993 |
| GB | 1549127 A | 8/1979 |
| JP | 61-39976 | 7/1984 |

OTHER PUBLICATIONS

Bull C. S. et al; "An Electrostatic Electron Gun", Metal Construction And British Welding Journal, vol. 2, No. 11, Nov. 1970, pp. 492–495.

*Primary Examiner*—Vip Patel
(74) *Attorney, Agent, or Firm*—Martin Novack

(57) ABSTRACT

A charged particle emitting assembly comprises an emitter member (5) for emitting charged particles of one polarity. A tubular shield electrode (6) circumferentially surrounds the emitter member and is held in use at the same polarity as the charged particles. A tubular accelerating electrode (7) is positioned substantially coaxially with the shield electrode (6) and is held in use at the opposite polarity to the shield electrode. The arrangement is such that charged particles from the emitter member (5) initially spread laterally outwardly and then are focused into a beam which passes through the tubular accelerating electrode (7).

37 Claims, 26 Drawing Sheets

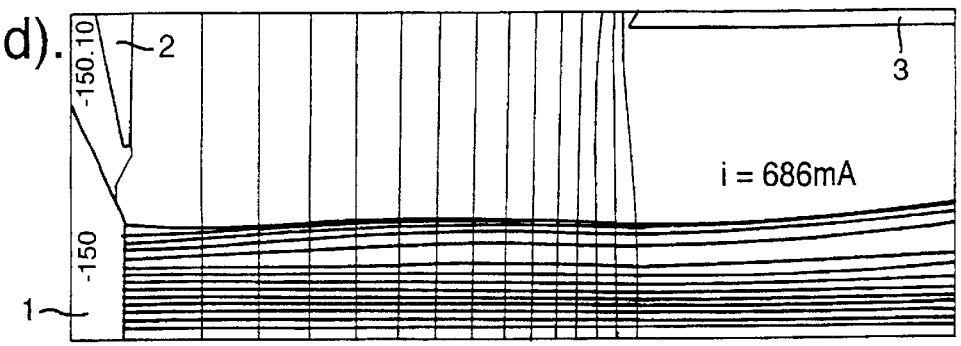
Fig.2(d). i = 686mA
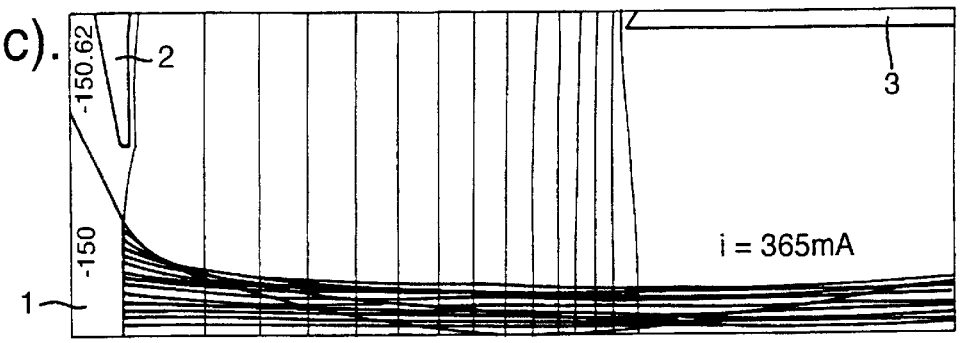
Fig.2(c). i = 365mA
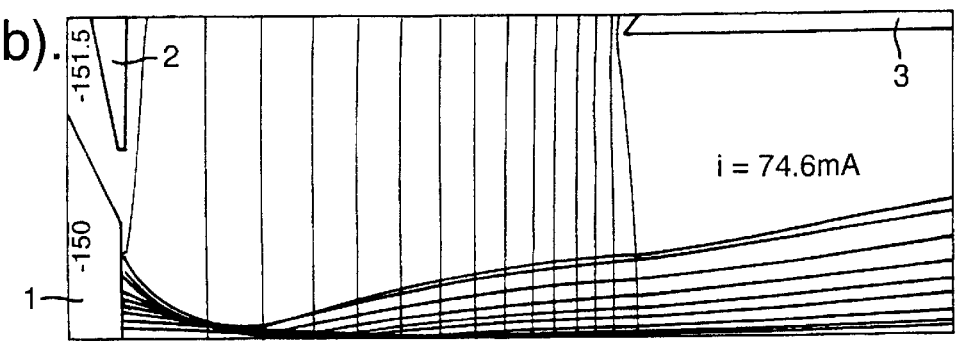
Fig.2(b). i = 74.6mA
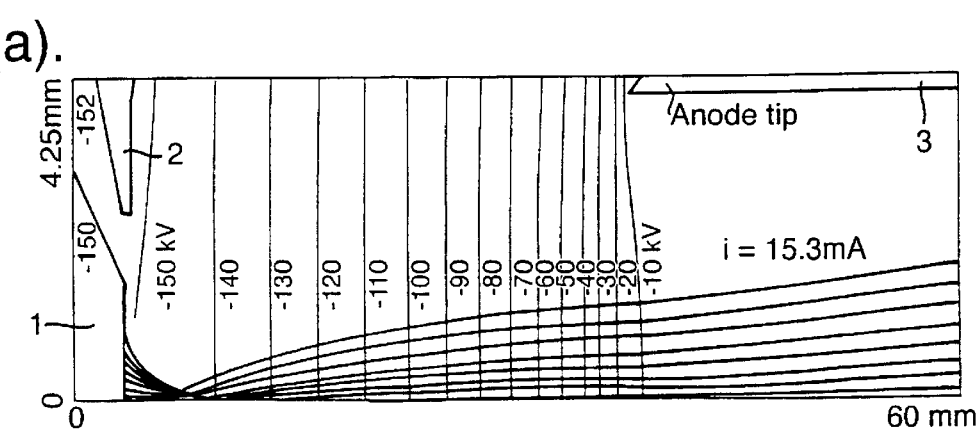
Fig.2(a). i = 15.3mA

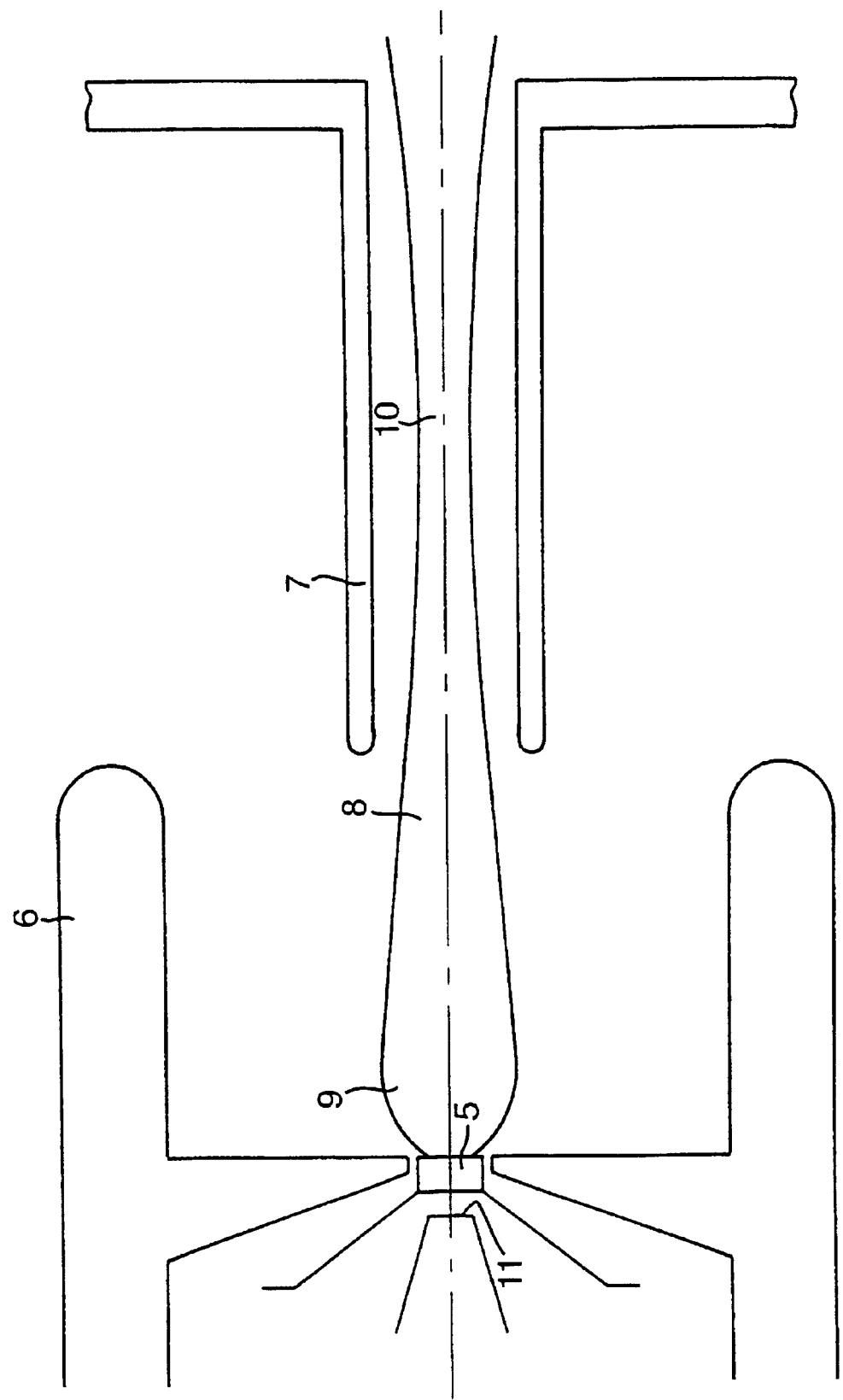

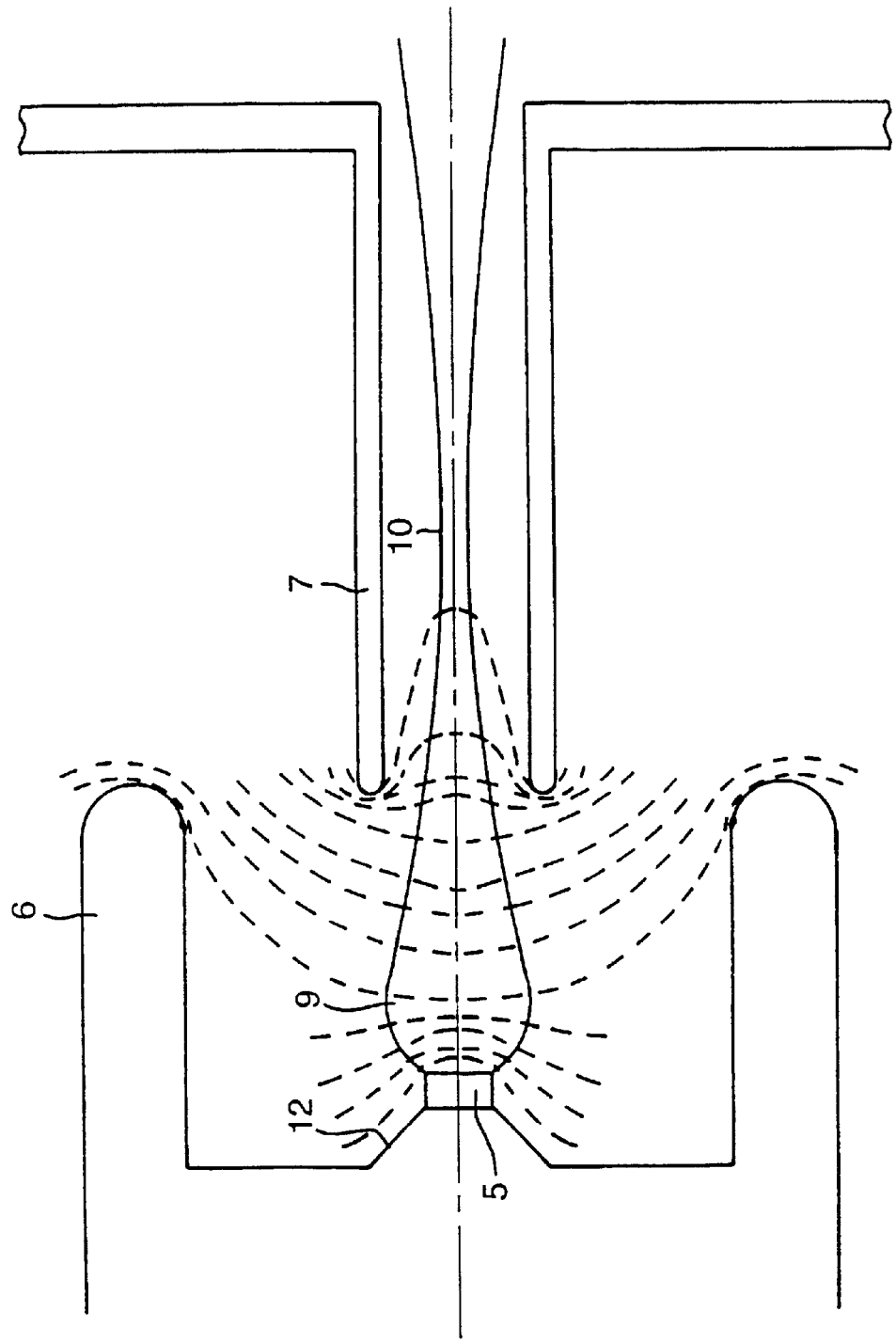

PARTICLE BEAM EMITTING ASSEMBLY

The invention relates to charged particle emitting assemblies and emitters. The invention is concerned for example with the generation of high power electron beams (EB) and transmission into vacuum chambers operated at pressures in the range approximately $10^{-1}$ mbar up to several hundred millibar. However, the invention is also applicable to other types of charged particle beams including those defined by negatively and positively charged ions. For convenience, only electron beams will be discussed.

Electron beams are readily produced by release of free electrons from an emitter and acceleration in an electric field. For electron beams which are merely used for applications such as vacuum melting of metals, beam quality in terms of energy density distribution, beam brightness and beam profile, is of little importance. Typically, "brightness" is defined as current density/steradian.

For other applications, beam quality is extremely important and moreover must be stable and reproducible. In the case of electron beam welding (EBW), for example, the ability to produce repeatedly deep narrow fusion zones of consistent depth and width is critically dependent on:
  i) the beam energy density distribution
  ii) the position of focus with respect to the workpiece surface, and
  iii) the beam brightness which involves both spot size and convergence angle factors.

Ideally, for electron beam welding, it is important to achieve a clearly defined energy density distribution and usually this is Gaussian in form. Also, to perform deep narrow welding, the angle of convergence of the beam needs to be controlled within a relatively tight range. Certainly for welding of steels, for example in section thickness of 100 mm–150 mm, a beam semi-angle of greater than 1 degree leads to weld pool instabilities and internal defects. A beam which is near parallel, on the other hand, may be highly suited to welding such thick sections but is unsuitable for producing very narrow welds in steel sections of 1 mm–10 mm. In addition, in the case of the thinner section range, welding beam energy distribution is much more important. If for any reason the energy distribution includes a significant fringe, this is reflected in the weld fusion zone shape. Thus, instead of achieving a near parallel fusion zone as in the case of the Gaussian distribution, a much wider non-parallel fusion zone with a so-called "nail head" feature is produced. More beam power is required for the same weld depth, lateral shrinkage after welding is overall greater and because of the wider weld width at the top compared with the bottom, uneven shrinkage occurs resulting in distortion of the component as indicated. For precision components this is often unacceptable and may also lead to weld cracking.

Similarly, it is important, particularly for thin section welding, to achieve sufficient intensity in the focal spot. For systems which produce a near parallel beam, even without fringes, insufficient intensity leads to relatively wide tapered fusion zones accompanied by excessive distortion and again a risk of cracking. Near parallel beams are not necessarily focusable, space charge spreading can still occur in a vacuum environment even in spite of strong positive ion neutralisation effects. Thus, for a near parallel beam entering a focusing lens attempts to focus a beam over long distance result in little if any reduction in the beam diameter. Indeed, the beam profile and intensity characteristics can often at medium and high powers, be totally dominated by ion-electron interactions.

It is, therefore, very important to launch the beam from the electron gun with a well defined divergence (within a specified range), high brightness, low aberration and without fringes.

One possible means of achieving higher convergence angle to combat space charge spreading in the medium to high beam current range with a triode gun is to employ electrodes which produce a more strongly focusing field. This, however, leads to excessive convergence at low current when the grid field becomes an additional powerful focusing element. Large swings in convergence angle are generally undesirable even for high vacuum EBW and present greater difficulties in a system which employ a beam transfer system for reduced pressure ($5\times10^{-1}$ to ~250 mbar) or non-vacuum (~1000 mbar) operation where fine bore nozzles are employed to restrict gas leakage into the gun region.

Yet another method of achieving greater convergence, to combat space charge spreading at high current levels, is to design a gun in which the cathode, grid electrode and anode are placed in close proximity. This leads to more rapid acceleration of the electrons over a shorter axial distance reducing the possibility of mutual electron repulsion. Unfortunately, such an arrangement increases the electrical surface stresses on the electrodes and can lead to increased high voltage breakdown tendency.

Avoidance of beam fringes and optimum focusing of electron beams is extremely important when the beam must be transmitted through narrow orifices in order to extract the electrons from the high vacuum ($5.10^{-5}$–$5.10^{-6}$ mbar) region of a gun housing into working chambers operating over the approximate pressure range of $5.10^{-2}$ to 1000 mbar. Here, the rate of leakage of gas from the working chamber into the gun housing is primarily determined by the diameter and length of the orifices apart from the number of orifices and the pumping capacity of the interstage pumps.

Beam fringes tend to contain large amounts of power and even for low total power operation (e.g. 5 kW), the ability to absorb this extraneous power on the orifice nozzles is limited even if substantial water cooling is applied; unlike electron microscope devices, where the beam power is extremely small, it is impractical to strip off the unwanted fringe on interception diaphragms. For similar reasons, it is important to avoid a low brightness, near parallel beam because of the large beam diameter.

Beam quality and whether or not a particular electron gun produces a pure un-aberrated beam with a well defined divergence is very dependent on gun design and particularly the cathode design and the detailed geometry of the electrodes in the immediate vicinity of the cathode.

Most electron guns used for EBW are triodes. The use of the grid electrode ensures that at low beam current, cathode emission is limited to a central portion of the cathode but the presence of the strong electric field created by the grid leads to considerable beam aberration.

The outer electron trajectories have a shorter focal length in the strong grid field because they are closer to the edge of the grid cup hole than the more central electrons. Also, as the grid voltage is reduced to increase beam current, the emission area expands and may even permit electrons to be released from the cathode edges where adverse geometrical features produce electron trajectory flight paths radically different to the main electron flow. In addition, the weakening grid field combined with increased space charge in the beam, as the beam current is increased, can result in gross spreading of the beam and loss of primary focus. Also, the primary focus waist and the virtual image position (apparent to the first focusing lens) can move considerable distances up and down the beam axis dependent on beam current level.

Beam fringes produced by such a gun, the drift of primary focus with beam current, the lack of beam convergence angle at high current and the relatively high convergence angle at low current, can adversely effect welding performance for even conventional systems projecting beams into relatively high vacuum chambers ($5 \times 10^{-3}$ mbar). For beams which need to be transmitted through small orifices, operations can be difficult or even impossible, particularly for high power (greater than say 30 kW) operation.

In accordance with a first aspect of the present invention, a charged particle emitting assembly comprises an emitter member for emitting charged particles of one polarity; a tubular shield electrode circumferentially surrounding the emitter member and held in use at the same polarity as the charged particles; and a tubular accelerating electrode positioned substantially coaxially with the shield electrode and held in use at the opposite polarity to the shield electrode, the arrangement being such that charged particles from the emitter member initially spread laterally outwardly and then are focused into a beam which passes through the tubular accelerating electrode.

The invention involves a special diode gun construction. A diode gun, compared with a triode, has many distinct advantages including:

i) it is possible to virtually eliminate aberration, ii) control of beam shape and quality at high current is more readily achieved than with a triode, iii) sufficient beam convergence can be achieved at high current without excessive convergence at low current, iv) under gun discharge conditions, when operated in the temperature limited mode, the beam current does not surge, unlike a triode gun where breakdown of the high voltage between the gun electrodes and ground precipitates shorting of the grid supply and instantaneous release of full beam power, v) the diode gun requires fewer auxiliary supplies (two in the case of a conventional indirectly heated diode; one if an RF excited indirectly heated diode; one if a directly heated diode), and vi) for a diode gun, the electrical cable and connections are simpler, particularly for an RF excited diode where only one HT connection is required and no auxiliary supply connections; the RF power is inductively coupled from a remotely spaced high frequency aerial or primary winding positioning within the gun housing.

For a diode gun, in the absence of the focusing action of the grid field, especially with a small diameter cathode, the high space charge density in the beam, particularly at high current levels, can result in spreading of the beam and lack of a well defined primary focus; indeed the beam may be insufficiently collimated to even pass through the anode hole. Of course, one solution to avoid excessive beam spreading would be to employ a large diameter cathode but this would fundamentally reduce beam brightness and complicate the equipment and increase the costs.

In the invention a distinct swell on the electron beam is created initially thus creating an artificially large beam source which can then be subsequently focused with a relatively high angle of convergence by the main cathode/anode electric field in the inter-electrode gun.

As regards the ultimate beam brightness which can be achieved in the beam for a given accelerating voltage, this depends on many factors, but for high power EBW guns it is very dependent on cathode diameter and gun design. Fundamentally, it is very important to minimise cathode diameter, since for a given beam convergence angle and operating voltage, anywhere in the post gun focusing system, the spot size is proportional to cathode diameter and proportional to the square root of the cathode operating temperature in degrees Kelvin.

The invention enables cathode diameter or more strictly emission diameter to be limited and so improves beam brightness. Moreover, limiting cathode diameter and cathode total surface area as well as operating temperature, reduces the auxiliary heating power requirements, auxiliary power supply costs and also minimises gun operating temperature and electrode geometry thermal distortion effects. Reducing gun heat input in turn reduces cooling requirements which invariably present difficulties for an EBW gun suspended in vacuum on the extremity of a long, high voltage insulator since the insulator is not only a poor conductor of electricity but also of heat.

Naturally, the cathode emission area must be adequate to produce the required beam current for a given cathode life, since ion erosion, oxidation and evaporation rates increase with cathode temperature; but much can be gained by optimising the conflicting emission density and beam brightness factors.

In one example of the present invention, beam focusing in the gun region in the presence of heavy space charge loading is achieved by means of a deeply recessed cathode shield electrode combined with a long small diameter anode, the extremity of which is positioned close to the end of the cathode shield electrode or even well inside it. This creates a strong focusing action which works well at low, medium and high power levels.

The beam swell or lateral spreading can be achieved in a number of ways. One method is to select cathode diameter and electrode geometry such that the electron acceleration is initially relatively slow, enabling space charge spreading to produce strong radial outward motion. This is achieved by setting a relatively small cathode inside a deeply recessed cathode shield cup. If the cathode diameter is too small, this limits the maximum beam current for a given accelerating voltage before the gun becomes space charge limited and the initial spreading actions can be so large that the subsequent convergent electrostatic field in the inter-electrode gap produced by the general cathode shield/anode geometride electrode form is insufficient to refocus the beam into a distinct waist or cross-over. On the other hand, if the cathode is too large, the emission density at the cathode is too low to produce the required initial beam expansion and consequently the beam has subsequently insufficient convergence to avoid spreading during the final period of acceleration. Thus, the combination of electrode shaping and cathode size is critical for a given accelerating voltage and power operation range to achieve the best performance.

A second method of achieving the artificially large electron source without the need for high current density at the cathode involves producing a suitable electrostatic field immediately in front of the cathode to cause the beam to diverge. This can be accomplished by mounting the cathode on top of a conical or cylindrical projecting member which stands proud of the base of the cathode shield cup.

The cathode can be in excess of 5 mm$^2$ in area, permitting operation at power levels in excess of 100 kW.

As described above, the initial beam swell created by space charge spreading is enhanced by a suitable electrostatic field. This increases the size of the apparent source after initial beam spreading, allowing a highly convergent beam to be produced with a well defined focus over a wide current range. Yet another possible means of promoting initial beam expansion is to shape the cathode surface as described below so that at least the emitter is essentially convex or conical.

The first aspect of the invention can be used in welding apparatus of various types including vacuum chambers operating in the pressure range $5\times10^{-5}$ mbar to $5\times10^{-2}$ mbar. However, the invention is particularly suitable for use with welding apparatus operating at intermediate pressure ranges, $10^{-1}$ mbar to several hundred mbar, and even at high pressures and non-vacuum.

Typical industry sectors which have identified the potential benefits of such equipment are thick section steel pipe producers, offshore and onshore pipe welders, nuclear waste disposal companies, power generation equipment producers and aerospace component manufacturers.

For many of these applications, the material wall thickness to be welded in a single pass is in excess of 15 mm and may be as high as 150 mm or more. In either case, the need to weld quickly demands beam power levels of at least 30 kW and in some cases up to 100 kW or more.

For all diode guns, including the ones described above, one major problem which has remained largely unsolved prior to this invention was the fact that the sides or edges of the cathode emitted unwanted electrons with uncontrolled flight paths. Numerous methods to prevent this occurring have been attempted spanning several decades of effort and many research and development teams. One of the simplest arrangements was described in the U.S. Pat. No. 3,878,424 (filed on Jul. 17, 1973) in which a planar diode was proposed to overcome the spherical aberration effect of the grid electrode. In this, oxide (e.g. barium-strontium-calcium) was packed into a hole in a refractory metal cathode "heater" plate which could be heated by various methods. In another variant, oxide was coated onto the surface of refractory metal plate. By heating the plate to a temperature well below the emission point of the refractory metal cathode plate, strong emission of the lower work function oxide occurred, thus avoiding edge effects. The proposed device may well be suitable for producing low power beams for electron microscopes where the oxide coating or plug in a hole is only some 100 microns in diameter, but for high power EBW guns which are continuously subjected to ion bombardment, gases and particulate matter from the weld pool, oxide cathodes would be rapidly poisoned destroying their emissive properties. Also, in the case of the oxide film this is typically only 50 microns thick and would be rapidly eroded in an EBW system. Moreover, the planar cathode plate would distort, causing adverse and unpredictable changes in beam divergence and beam projection direction. Differential expansion between the two different materials could also cause cracking and spalling of the emitter.

In yet another attempt to avoid extraneous edge emission, Bull et al, "An electrostatic electron gun", Metal Construction and B.W.J. November 1970 2 (11), p. 490, produced a spherical electrode, indirectly heated diode gun in which perforations were placed around a refractory metal cathode electrode to confine emission to a central area. This gun, however, also suffered from thermal distortion of the central cathode region and the perforation allowed electrons to pass through from the primary back bombardment into the main beam causing further main beam distortion effects. Some reduction in the flow of primary electrons was achieved by insertion of additional electron barriers on the rear of the cathode shield but cathode distortion remained a problem.

We have considered numerous other methods of controlling edge emission.

Leakage of primary electrons into the beam can be prevented by mounting the cathode on a continuous conical member as will be described in more detail below.

Cathodes of a similar form have also been assembled from two materials exhibiting different work functions, where the emitter is made from a low function material such as lanthanum hexaboride, which is not easily poisoned during EBW, and on outer supporting structure made from a refractory metal such as tantalum. Such an arrangement is also described in EP-A-0627121. Similar arrangements have been separately developed and described in GB-A-1549127 but this particular gun was distinctly different to the present invention in many respects.

In these earlier developments in order to support the lanthanum hexaboride button it was necessary to place it behind a lip in the refractory metal holder. The lip still strongly disturbed the electric field and resulted in appreciable spherical aberration in which the outer electrons were, as in the case of triode guns, focused at a shorter focal length than those near the axis. Lip thickness can be reduced by careful machining or by placing a thin refractory metal washer in front of the cathode, but in both cases thermal distortion caused the lip to distort outwards leading again to extraneous electron emission from behind the lip or washer.

Another technique which has been partially successful is the coating of the outer annulus of the exposed low work function material with a high work function material. For example, the cathode made from say lanthanum hexaboride, was coated around its periphery and in an annular form on the front face with tungsten. Although initially promising, this technique suffered from loss of the coating by ion damage, oxidation and evaporation in service. It was also difficult to avoid damaging the thin coating during assembly. In addition, the lip of the holder, although imparting a reduced focusing effect, nevertheless still produced unacceptable aberration.

Yet another technique which can be applied is to braze the lower work function material button into the holder using a compound such as molybdenum disilicide. Achieving a high quality non-porous braze without contaminating the $LaB_6$ material was problematic and in the best cases the braze material tended to crack in service due to repeated thermal cycling.

In accordance with a second aspect of the present invention, a charged particle emitter comprises an emitter member mounted in an aperture of a support member to which it is electrically connected, the emitter member having a lower work function than the support member whereby at a working temperature, the emitter member emits charged particles from an exposed surface characterised in that the exposed surface of the emitter member is set back from or preferably substantially flush with an outwardly facing surface of the support member surrounding the aperture.

In the preferred form of the invention, the low work function cathode material is machined to a "hat" shaped form which snugly fits into a central hole. Conveniently, the emitter member is a close fit in the aperture of the support member.

Part of the support member and part of the emitter member may be correspondingly tapered.

Alternatively, or additionally, the emitter member may be secured to the support member by a clip which engages each member.

In particularly preferred arrangements, the exposed surface of the emitter member and the outwardly facing surface of the support member define a common plane.

In accordance with a third aspect of the present invention, a charged particle beam column assembly for mounting to an evacuated charged particle beam source chamber has a sequence of controlled pressure chambers, each having inlet and outlet apertures through which a charged particle beam can pass and an evacuation port for connection to a pump to enable the pressure in the chamber to be controlled, whereby the pressure in successive chambers increases in use and is characterised in that an evacuation port is connected to a downstream chamber via a conduit which extends within the assembly past at least one upstream chamber.

This enables rapid removal and insertion of a replacement gun column for maintenance purposes. Conventionally, multi-stage pumped systems contain side intrusions to apply the pumping between the various nozzle restrictions. This makes for a complex column geometry which cannot easily be inserted and withdrawn from the vacuum chamber. The innovative step of concentric pumping overcomes these difficulties and is particularly important for applications such as offshore J-pipe laying where time is of the essence because of the very high cost of the hire of the large laying barge and the fact that only one pipeline can be welded and laid at any one time.

In more detail, this facet of the invention relates to providing a series of vacuum or partial vacuum chambers or ports in a compact arrangement or apparatus. In particular, this invention can be applied to so-called non-vacuum or Reduced Pressure EB systems in which the gun head comprises a plurality of chambers, ranging from vacuum in the region of the cathode to near-atmospheric pressure at the output end where the beam emanates into the open environment. These chambers have to be maintained at appropriate partial vacuum pressures, which permit the electron beam to pass through. This invention could also be implemented with the last chamber at or even above atmospheric pressure, for example if underwater welding is to be performed.

Such apparatus is commonly awkward in construction in so far as it requires several different vacuum pumping lines connected to the respective chambers in the gun head, these connections limit the access in the region of the output beam. Not only is such apparatus bulky, but the restricted access in the region of the various chambers limits the efficiency of the vacuum pumping. Therefore, the several vacuum lines have to be of a relatively large bore so as not to further restrict and impede the vacuum pumping.

This aspect of the invention provides a relatively compact and slim design of such a sequence of chambers, for example, as used in non-vacuum and Reduced Pressure EB welding systems. The invention can also provide a plurality of chambers, especially in the output region of the gun head, which are less than typically 170 mm in diameter, at least for the lower (or output) half of the head assembly. The use of vacuum lines or pipes near the operating output of the gun head can be avoided and in addition means for efficient pumping of the chambers (which are preferably maintained at appropriate pressures ranging from near-vacuum to near-atmospheric) can be provided.

In one arrangement, the chambers are defined by a set of tubular sections located within an outer tube, each tubular section having a radially outwardly facing opening, the radially outwardly facing opening of each chamber being circumferentially offset from the radially outwardly facing openings of all the other chambers; and a set of axially extending dividing walls positioned between the tubular sections and the outer tube to form the respective conduits, each conduit connecting the radially outwardly facing opening of a chamber with a corresponding evacuation port.

Alternatively, the plurality of chambers may be arranged as a sequence of discs carrying appropriate orifices, the set being fitted within a common sleeve, which is segmented. Each segment permits access to its respective chamber or port with good cross-section, as is the case with the concentric arrangement.

Yet again, a combination of concentric tubular sections and segmented cylinders may be utilised to give appropriate efficient vacuum pumping at the pressures concerned, with suitable cross-sections of access to the port or chamber respectively.

The array of chambers can be readily dismantled for replacement of the orifices, which may become partially blocked due to metal spatter or may be damaged by interception with the electron beam. Thus, provision is made for assembly and disassembly of the concentric tubular sections (or cups) or segmented cylinders respectively, while still maintaining adequate alignment of the orifices to the axis of the beam. This arrangement also reduces the leakage path between the chambers operating at partial pressure and the surrounding atmosphere. It will be appreciated that in the concentric arrangement, the regions of higher vacuum are contained within regions of partial pressure and hence are not directly exposed to the surrounding environmental atmosphere this greatly diminishes the effects of any small leak in seals.

In the case of the concentric cup arrangement, each part may have an integral screw fitting onto a common base carrying corresponding threaded portions together with, if desired, "O" ring seals. The cups may be provided with vanes, spacers or the equivalent to maintain their relative concentricity in assembly.

Likewise for the segmented arrangement, the corresponding parts may fit together with compressible seals as well as being held mechanically at the appropriate spacing and concentricity. In all these arrangements, the vacuum pumping lines are taken essentially to the rear of the gun head away from the output beam through appropriate connectors to the respective segments or annular orifices of the compact assembly of chambers operating at differential pressures.

Some examples of electron beam generating assemblies and welding apparatus incorporating such assemblies will now be described and contrasted with known assemblies with reference to the accompanying drawings, in which:

FIGS. 2a–2d illustrate the effect of changing grid bias voltage on beam profile and beam current for the triode gun shown in FIG. 1;

FIG. 3 is a schematic, longitudinal section of a first example of an electron beam gun according to the present invention;

FIG. 4 is a schematic, longitudinal section through a second example of an electron beam gun according to the invention;

Figure 1:
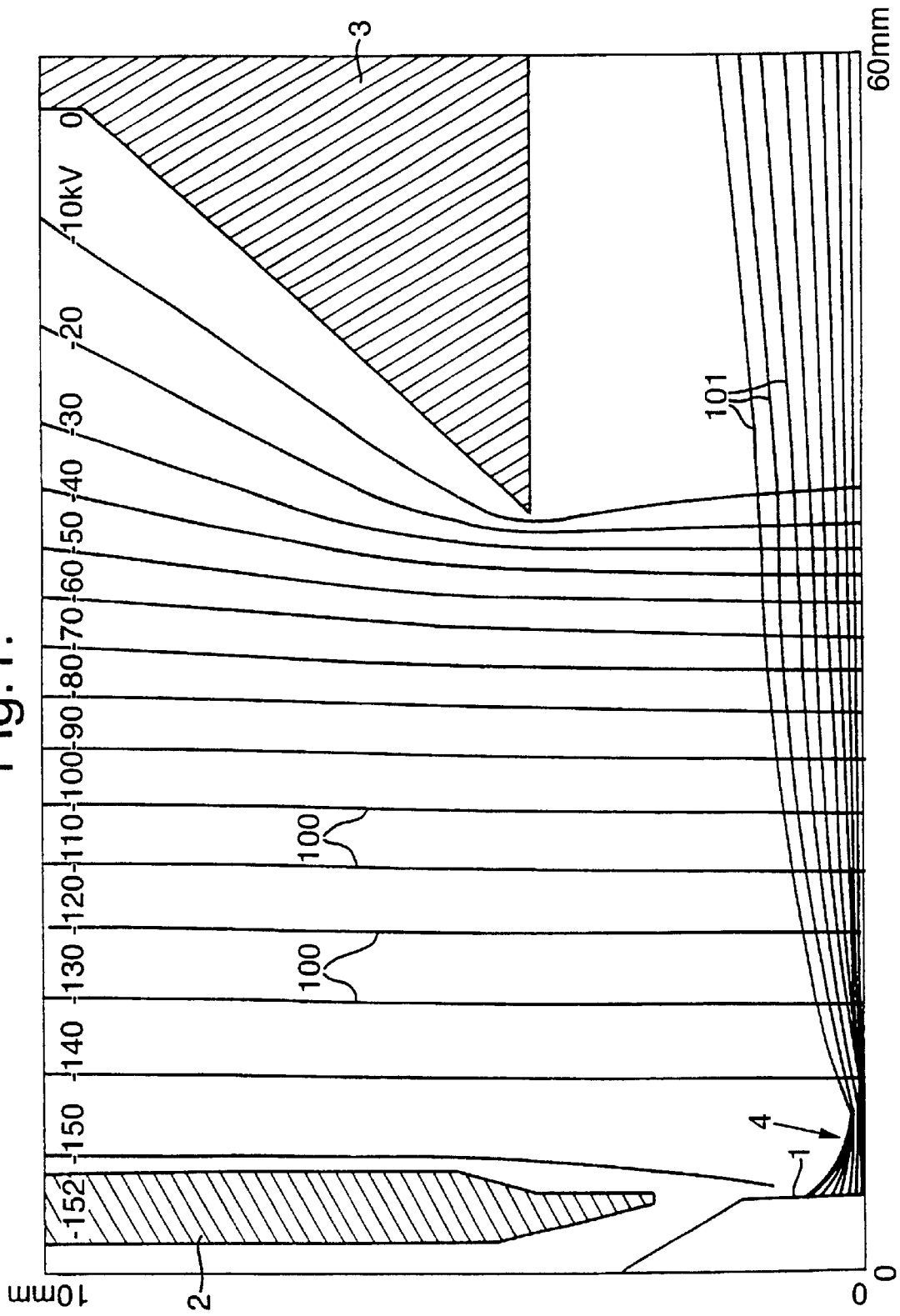
FIG. 1 is a partial section through a known triode gun illustrating electron trajectories and equipotential lines.

In order to understand the invention, an example of a known triode electron beam gun is illustrated partially in FIG. 1 with beam conditions 150 kV×15.3 mA, grid bias voltage −2 kV. The gun includes an electron emitting filament 1 surrounded by a grid cup 2 and aligned with a spaced anode 3. Equipotential lines 100 are shown in FIG. 1 as are some of the electron trajectories 101. As can be seen, the outer electron trajectories have a shorter focal length in the strong grid field because they are closer to the edge of the grid cup hole than the more central electrons. In addition, the weakening grid field combined with increased space charge in the beam, as the beam current is increased, can result in gross spreading of the beam and loss of primary focus. Also, the primary focus waist 4 has a virtual image position which can move considerable distances up and down the beam axis dependent on beam current level as can be seen in FIGS. 2a–2d (with beam currents "i" as shown).

The invention is concerned with a diode gun in which no grid field is present to provide any focusing action. Consequently, especially with a small diameter cathode, the high space charge density in the beam, particularly at high current levels, can result in spreading of the beam and lack of a well defined primary focus. In one embodiment, shown in FIG. 3, a cathode 5 is provided in a deeply recessed cathode shield electrode 6, the cathode 5 being aligned with a cylindrical anode 7 having a relatively long length. The end of the anode 7 facing the cathode 5 is positioned close to a plane defined by the end of the cathode shield 6 or may be provided well within the volume of cathode shield 6. This creates a strong focusing action which works well at low, medium and high power levels. The form of the beam is illustrated at 8 and it will be seen that initially electrons spread laterally to form a swell 9 and are then focused towards a waist 10 within the anode 7. The effect of the swell 9 is to produce an artificially large beam source which can then be subsequently focused at a relatively high angle of convergence by the main cathode/electrode field in the inter-electrode gap. In this case, the cathode 5 is heated by a filament 11 in a conventional manner to cause the emission of electrons.

The effect of setting the cathode 5 inside a deeply recessed cathode shield cup 6 is that electron acceleration is initially relatively slow enabling space charge spreading to produce a strong outward radial motion.

A second method of achieving the artificially large electron source without the need for high current density at the cathode is shown in FIG. 4 and involves producing an electrostatic field immediately in front of the cathode which causes divergence of the electron beam. In this case, the cathode 5 is mounted on top of a conical support 21 forming part of the base of the cathode shield 6 and projecting into the volume of the shield 6.

Figure 5:
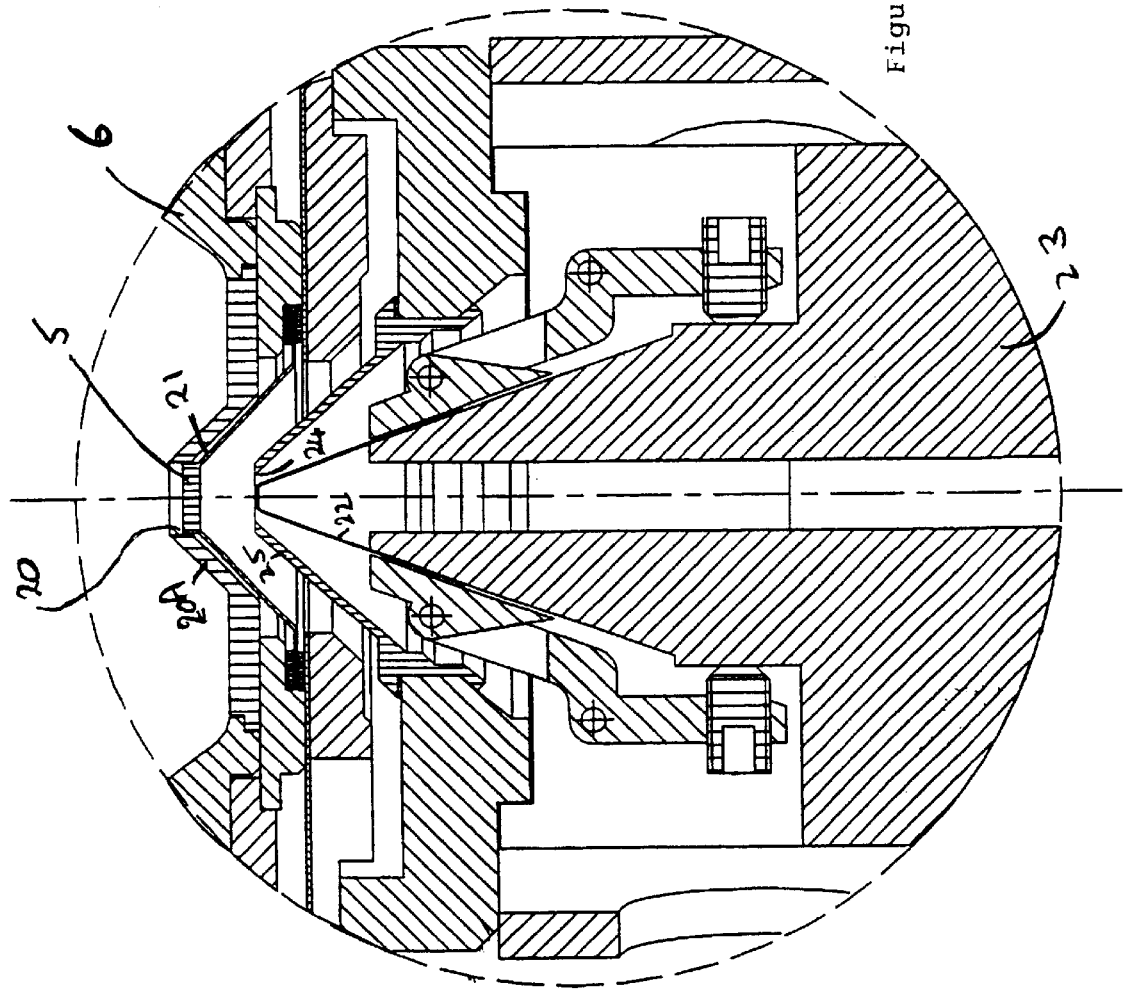
FIG. 5 is a cross-section through part of the cathode assembly of the gun shown in FIG. 4.

As previously mentioned, one problem with known diode guns is the emission of unwanted electrons from the sides or edges of the cathode. FIG. 5 illustrates one arrangement which minimises or avoids this problem. The cathode 5 is mounted in a cathode cone 21 within an aperture 20 of a conical projection 20A of the base of the cathode shield 6. Beneath the cathode is positioned a filament 22 supported by a filament holder 23. The filament 22 is exposed to the cathode 5 through an aperture 24 of a cone-shaped protector 25.

This confines the primary electrons between the primary filament 22 and the cathode cone 21. In this particular example, edge emission of the solid refractory metal cathode 5 was minimised by surrounding the cathode by a cone mounted onto the main cathode shield. The radial cone to cathode separation distance was preferably in the range 0.05 mm to 0.1 mm measured at ambient temperature for a 4.5 mm diameter cathode button. This reduced edge emission but did not eliminate it. By setting the cathode back 0.3 mm behind the cone 21, further beam improvements were made but some edge emission and spherical aberration, caused by the geometrical discontinuity between the cathode and cathode shield electrode in the vicinity of the cathode, still occurred. Nevertheless, this gun design successfully produced beam powers up to 100 kW at 150 kV and high quality welds when projected into a relatively high vacuum ($5 \times 10^{-3}$ mbar) environment.

Figure 6:
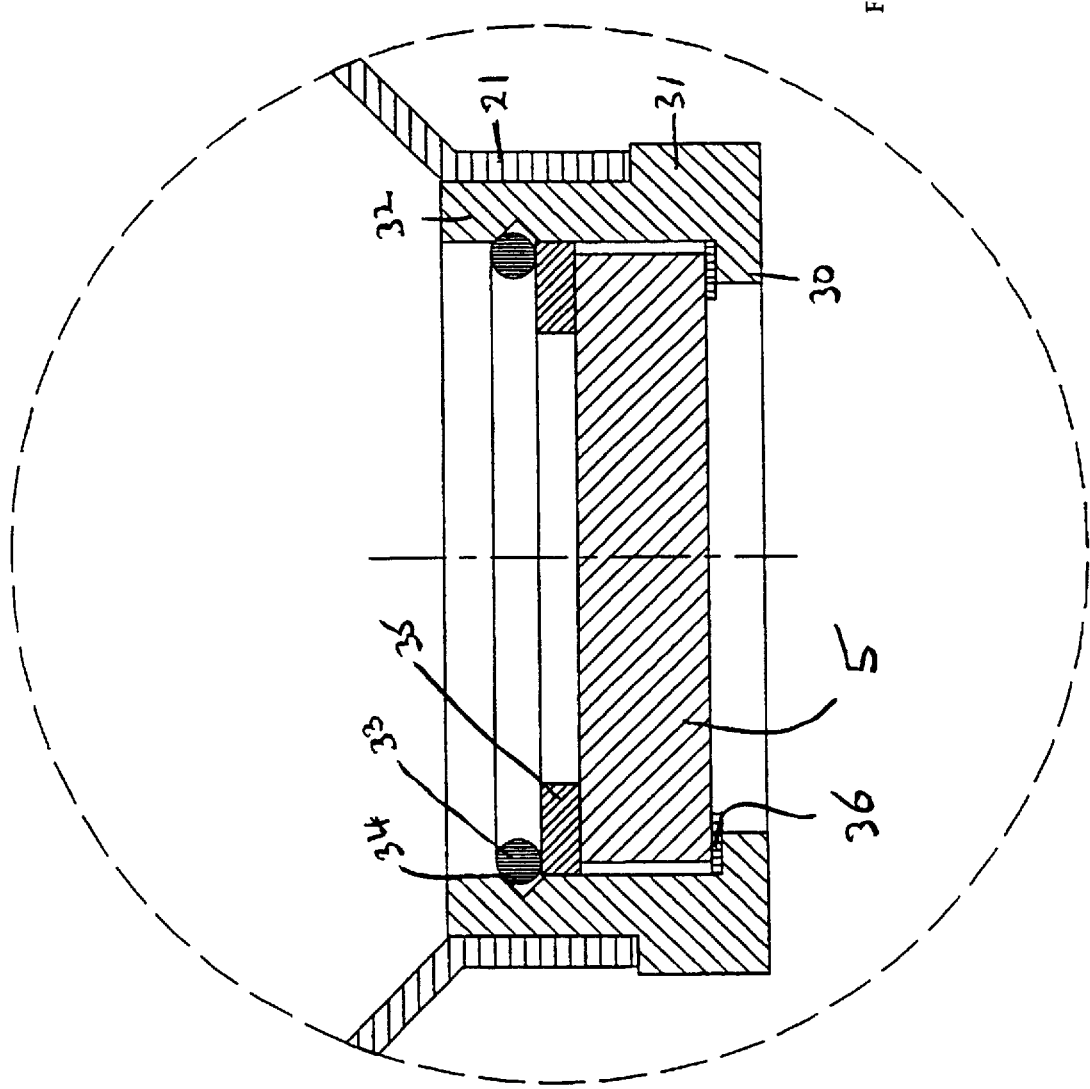
FIGS. 6 to 14 are cross-sections through a set of different mounting arrangements for the cathode assembly.

An alternative mounting arrangement for the cathode 5 is shown in FIG. 6. In this case, the cathode 5 is held against a radially inwardly facing lip 30 of a cathode holder 31 having a spigot section 32 retained, for example, by welding, in the cylindrical portion of the cathode cone, 21. The cathode 5 is held in position by means of a circlip 33 located and retained in a recess 34 of the spigot portion 32 and acting against an annular spacer 35. For an emission diameter of approximately 4 mm, the thickness of the lip 30 is typically 0.1 mm–0.3 mm. The effective discontinuity can be reduced by placing a thin refractory metal washer 36 in front of the cathode 5 but in both cases thermal distortion can cause the washer or lip to distort outwards leading again to some extraneous electron emission from behind the washer or lip.

Figure 7:
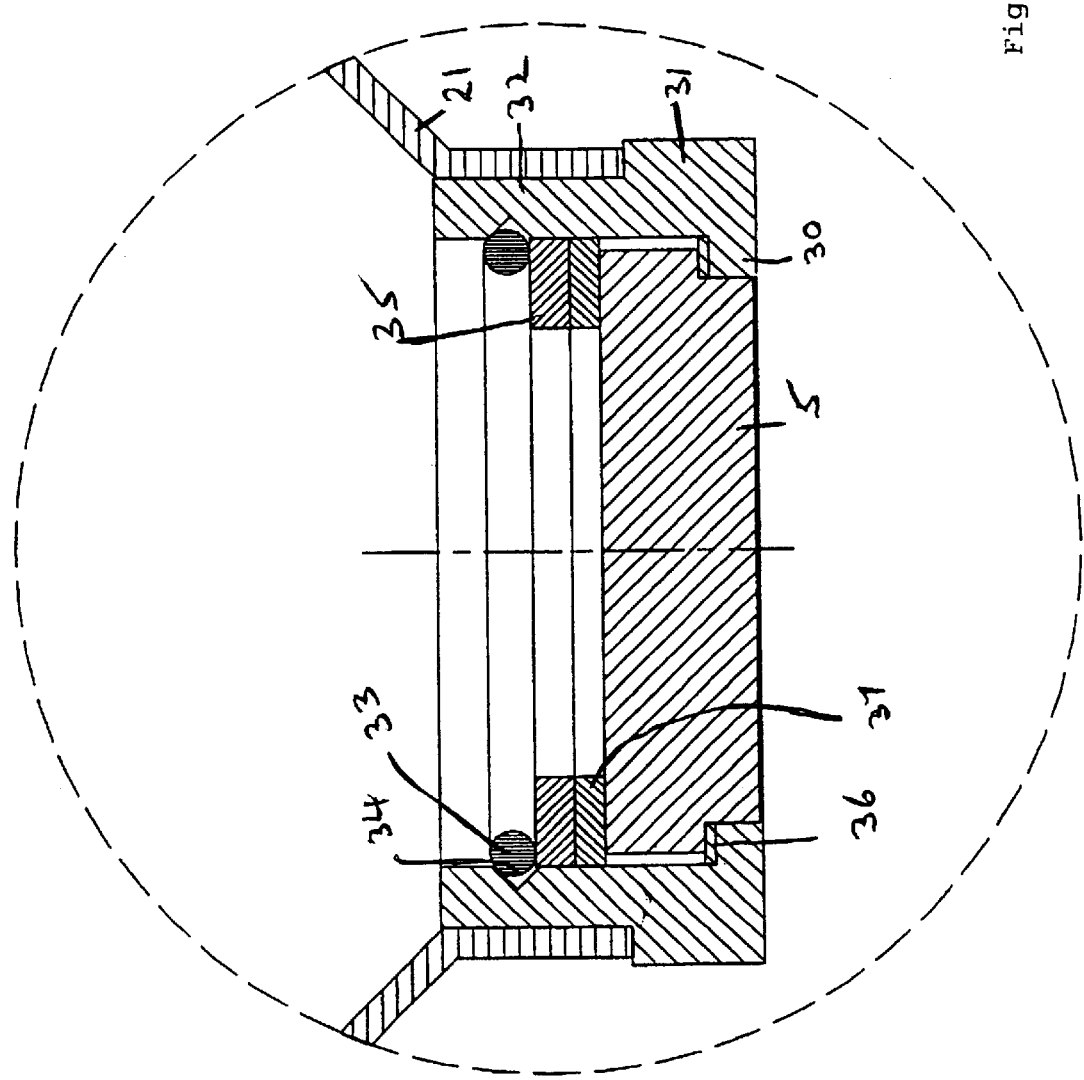

The preferred approach is shown in FIG. 7. As can be seen, the low work function cathode material is machined to a "hat"-shaped form which snugly fits into a central hole of the cathode holder 31 defined by the lip 30.

The machining of lanthanum hexaboride and other materials can be carried out by laser techniques or spark erosion. This form of cathode in which the emitter button 5 is held in place by a refractory metal "C" clip 33 mounted in the groove 34 produces very little extraneous emissions as proved by detailed computer analysis using finite element software and also by extensive practical tests at beam power levels up to 100 kW and operating voltages of up to 200 kV. The cathode button face is set ideally flush with the edge of the metal holder or set back a maximum of 0.040 mm.

The washers 35,36,37 are made of tantalum and it will be noted that the packing washer 35 protrudes just above the edge of the groove 34, typically by about 0.03 mm, to allow the tungsten wire circlip 33 to maintain a compressive force.

Figure 8:
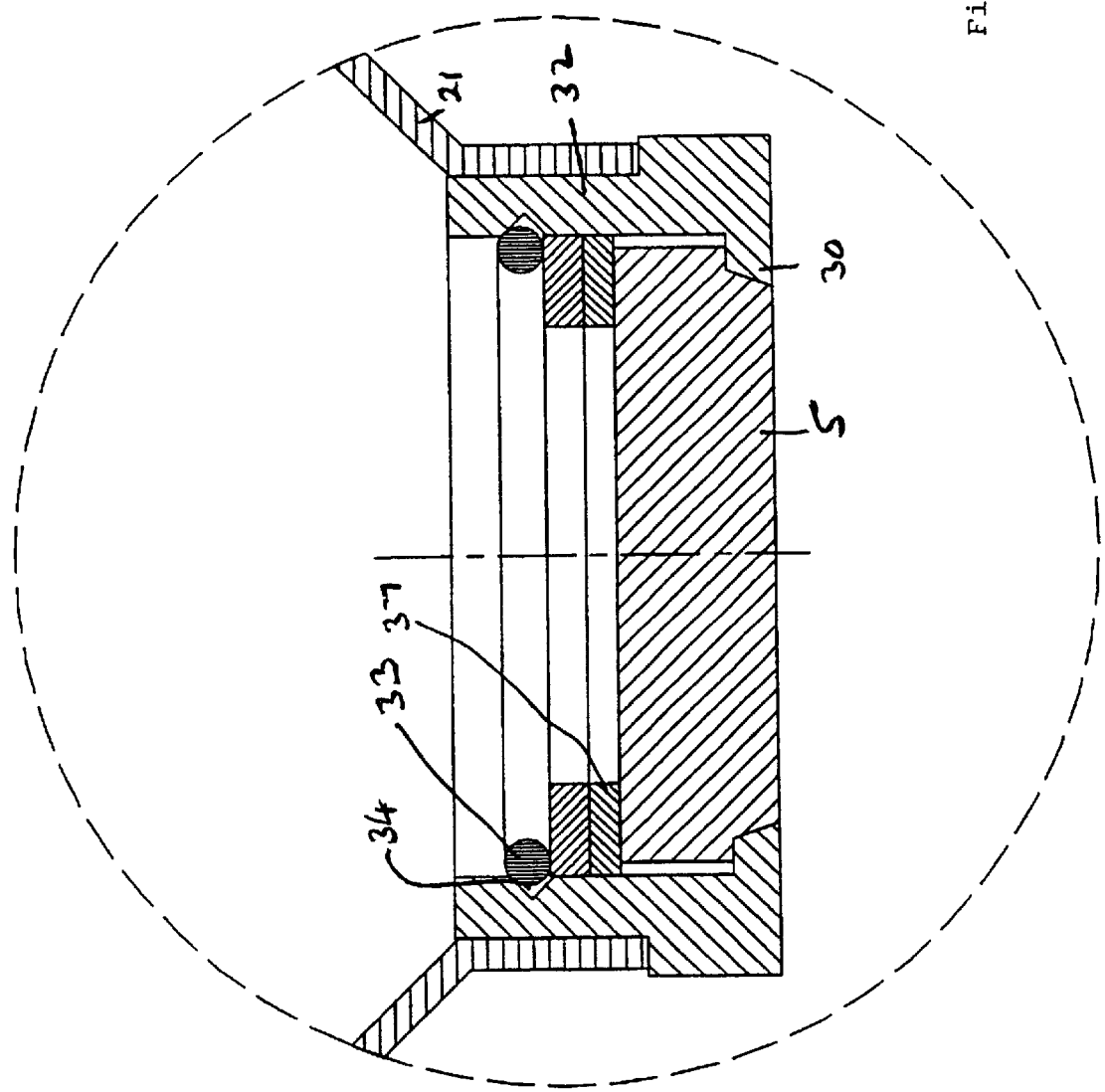
Figure 9:
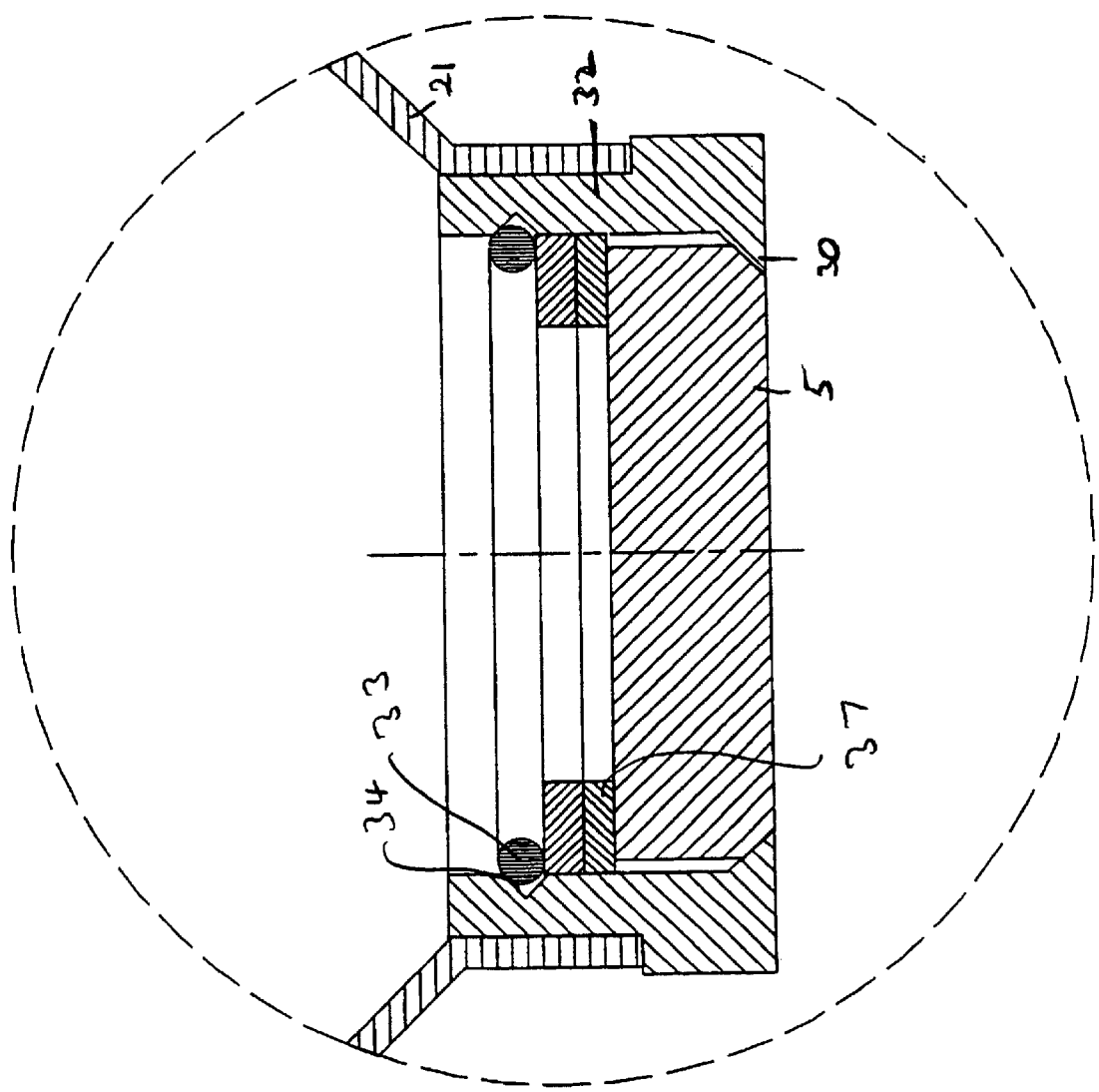
Figure 10:
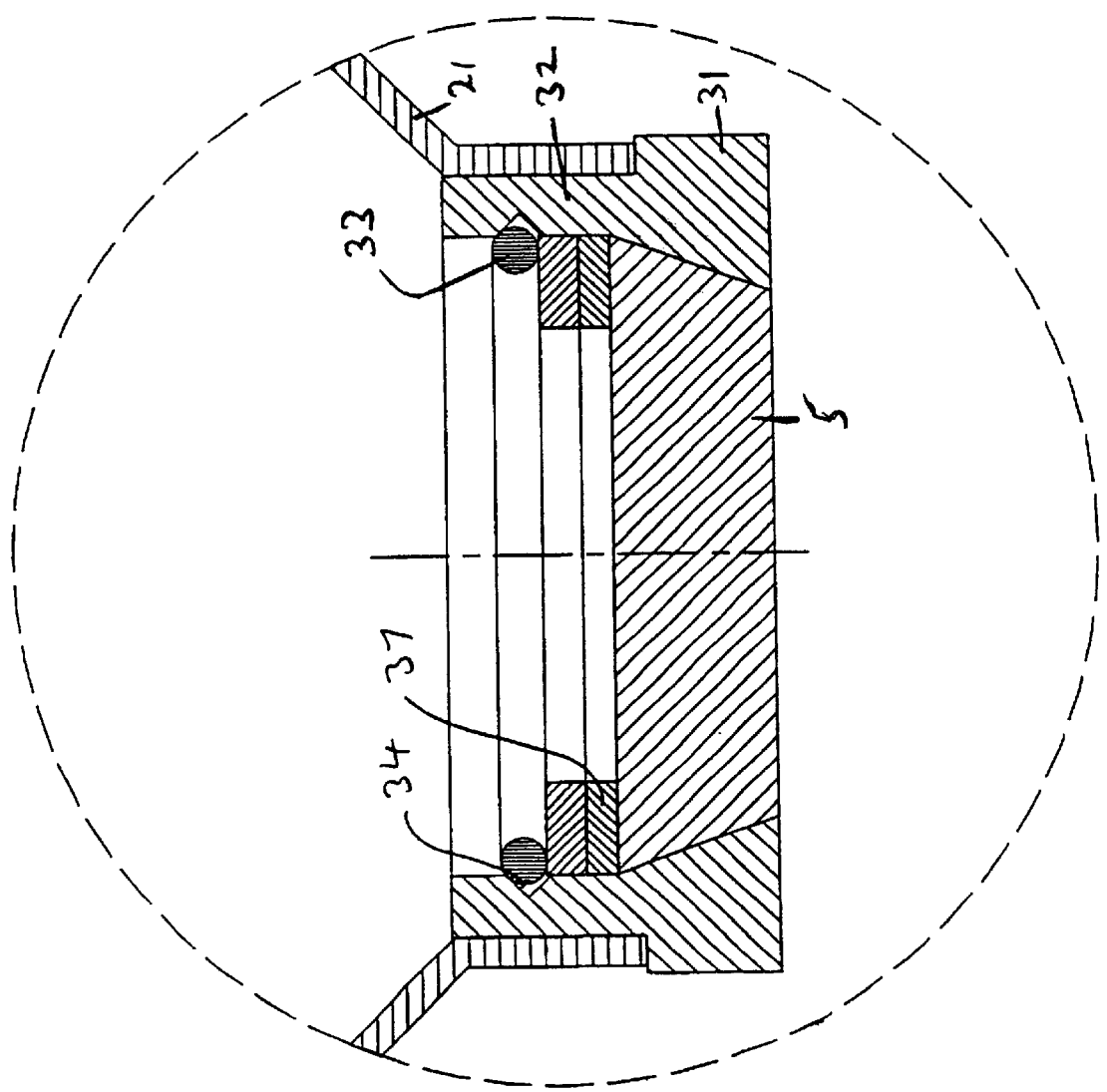
Figure 11:
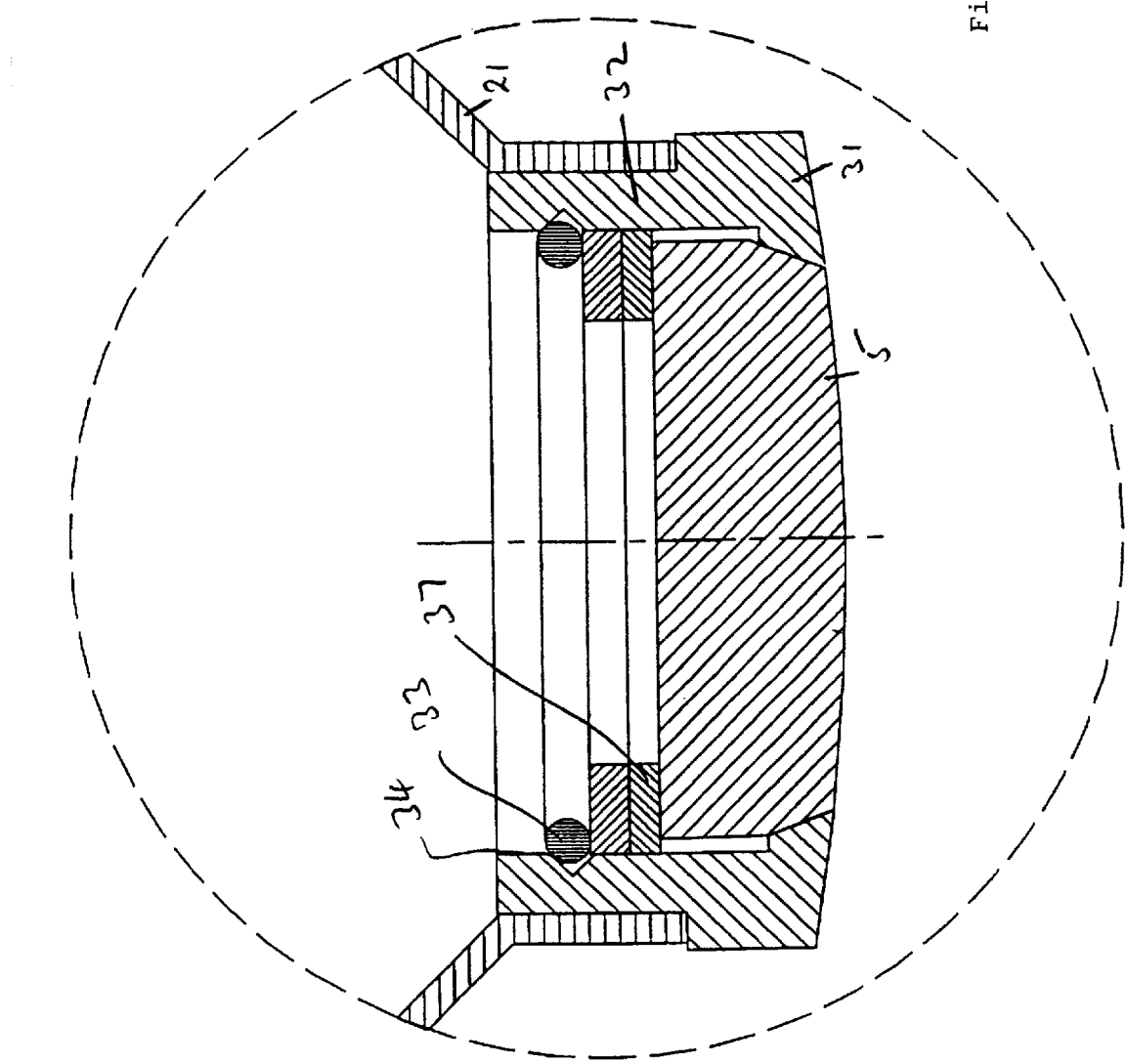
Figure 12:
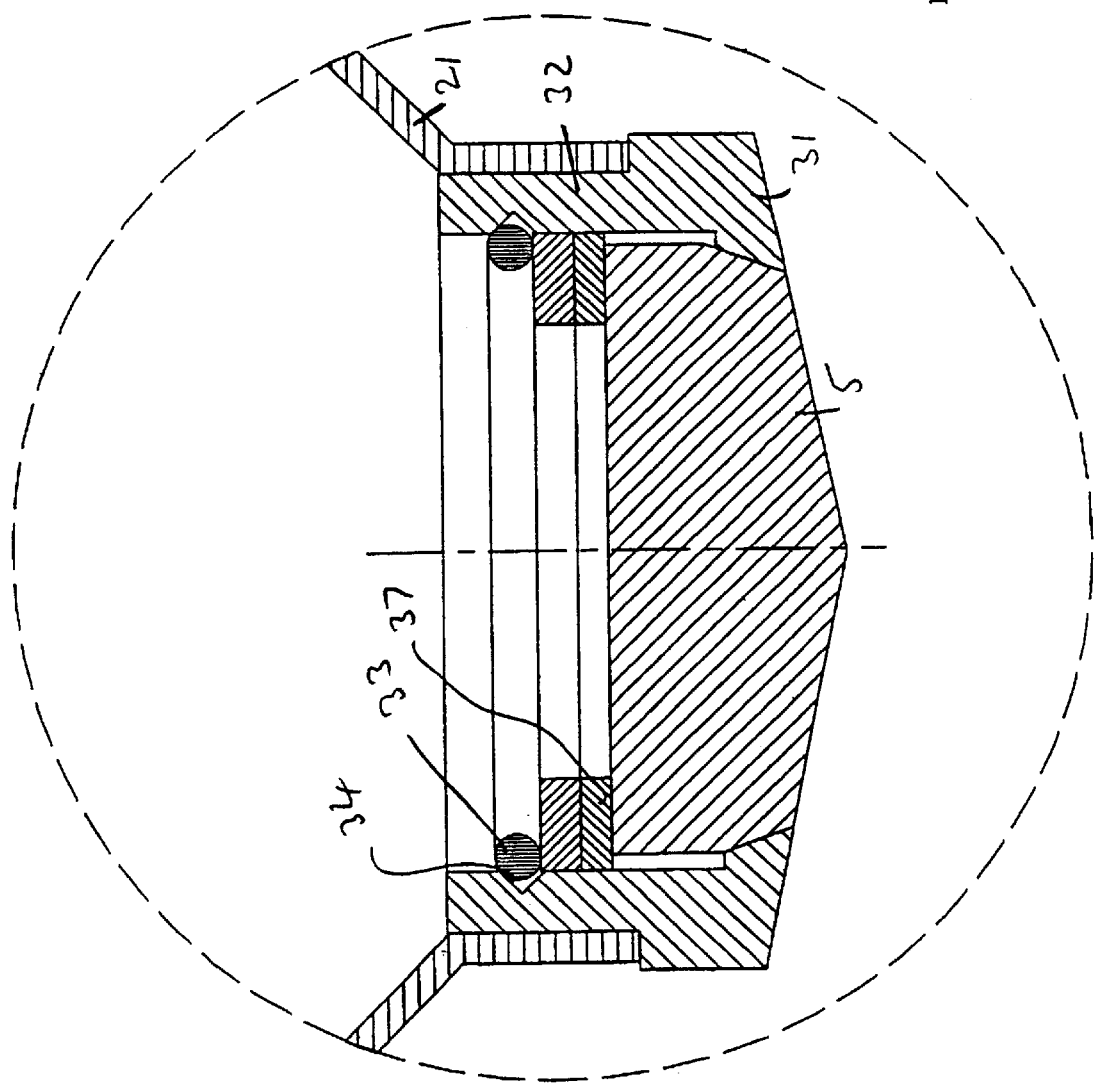
Figure 13:
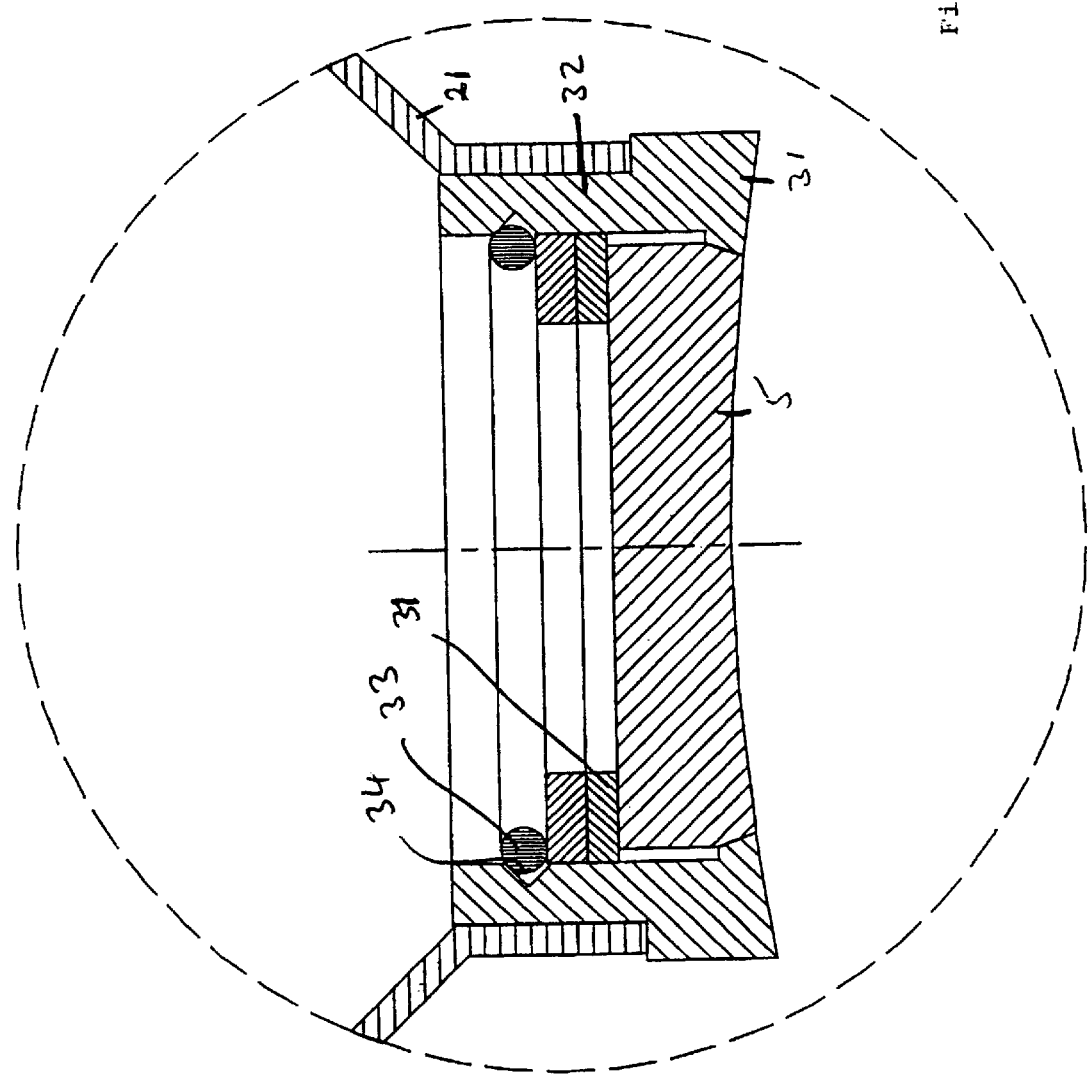
Figure 14:
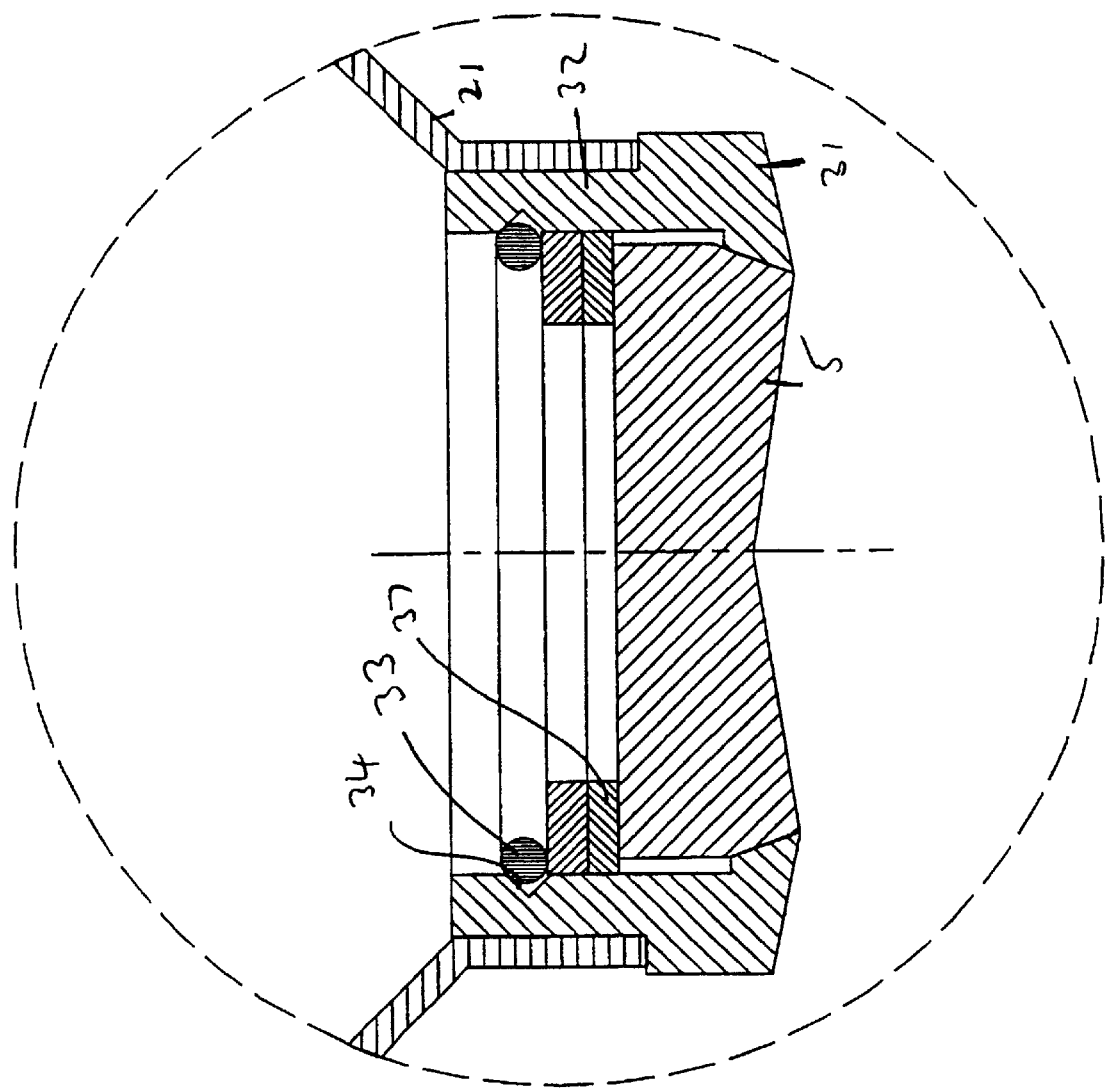

The cathode 5 and holder 31 can be shaped in a number of ways to achieve a snug fit in order to minimise edge emission yet avoiding surface discontinuities or steps as shown in FIGS. 8 to 10. Thus, in FIG. 8, the edge of the lip 30 and the corresponding surface of the cathode 5 are tapered in a similar manner. In FIG. 9, the cathode 5 has a simply tapered leading portion without an indent as in the previous examples. In FIG. 10, the cathode 5 has a frusto-conical form which corresponds with a similar shape for the internal surface of the holder 31.

It has also proved possible initially to mount the cathode 5 slightly protruding allowing subsequently careful surface grinding so that there is no discontinuity or step between the emitter and surrounding holder edge.

Preferably, the area of contact between the edge of the cathode button 5 and the refractory metal holder 31 should be minimised as shown, for example in FIGS. 7 and 9 to reduce heat losses.

Of course, it is also possible to profile the combined cathode and holder front face to achieve convex, conical, concave or re-entrant conical forms to achieve enhanced beam shaping effects, as shown in FIGS. 11 to 14 respectively.

The use of cathode buttons and the method of mounting to avoid edge emission when used in conjunction with the diode gun, in which an initial beam swell is induced in order to achieve the subsequent strong electrode focusing, has proved highly successful for high vacuum, reduced pressure and non-vacuum operation. In the latter two cases, nozzle interception and heating has been reduced to negligible levels over a wide range of power and voltage operation levels. Furthermore, even when the beam current is adjusted from zero to full power, the relatively small change in primary focus position is such that little or no adjustment is necessary to the first focusing lens current which is employed to focus the beam through the nozzle assemblies. This makes operation of the equipment very simple compared with previous diode guns and especially triode guns where spherical aberration effects and severe movement of the primary cross-over are inherent characteristics.

Figure 15:
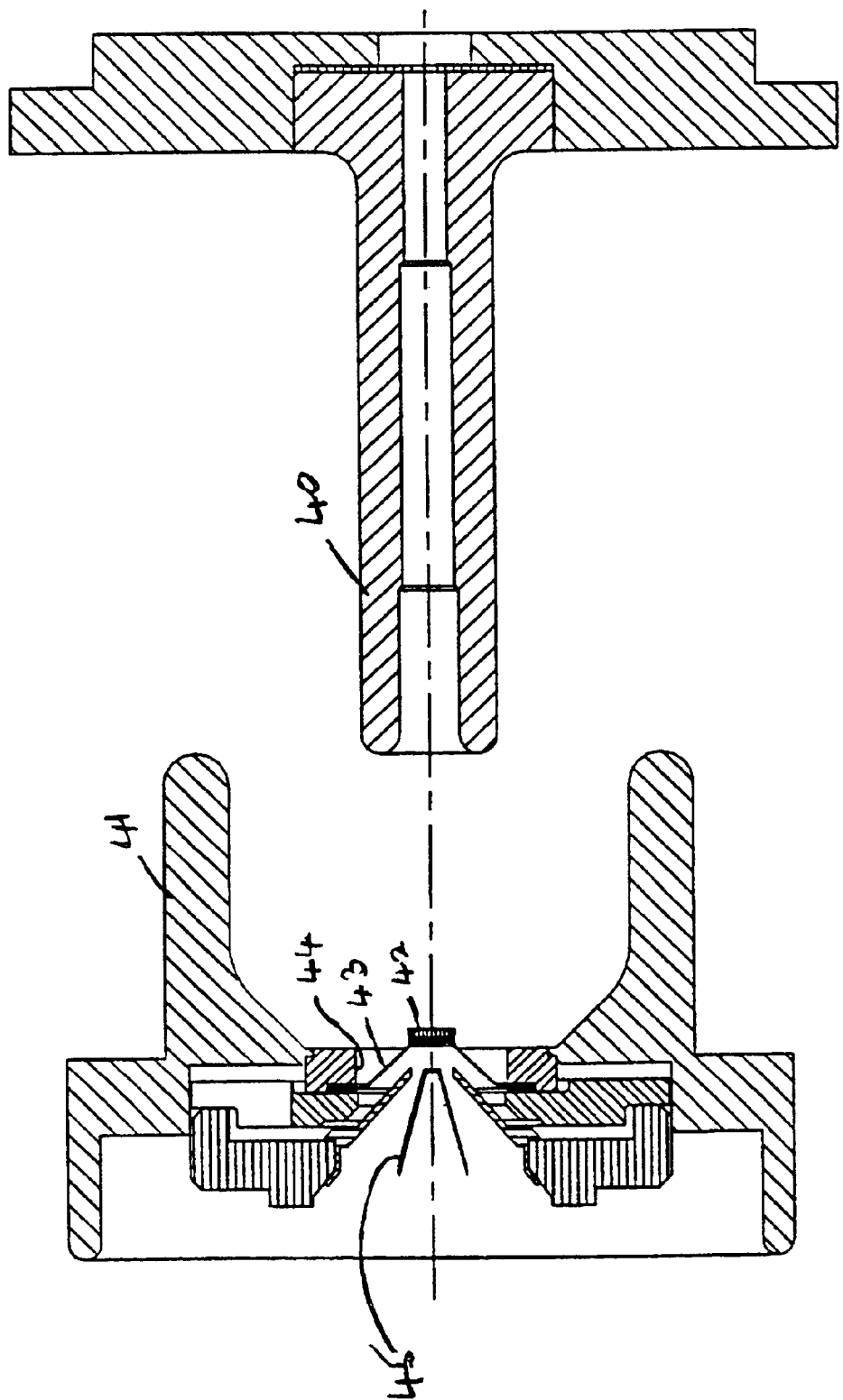
FIG. 15 is a longitudinal section through a third example of an electron beam gun according to the invention.
Figure 16:
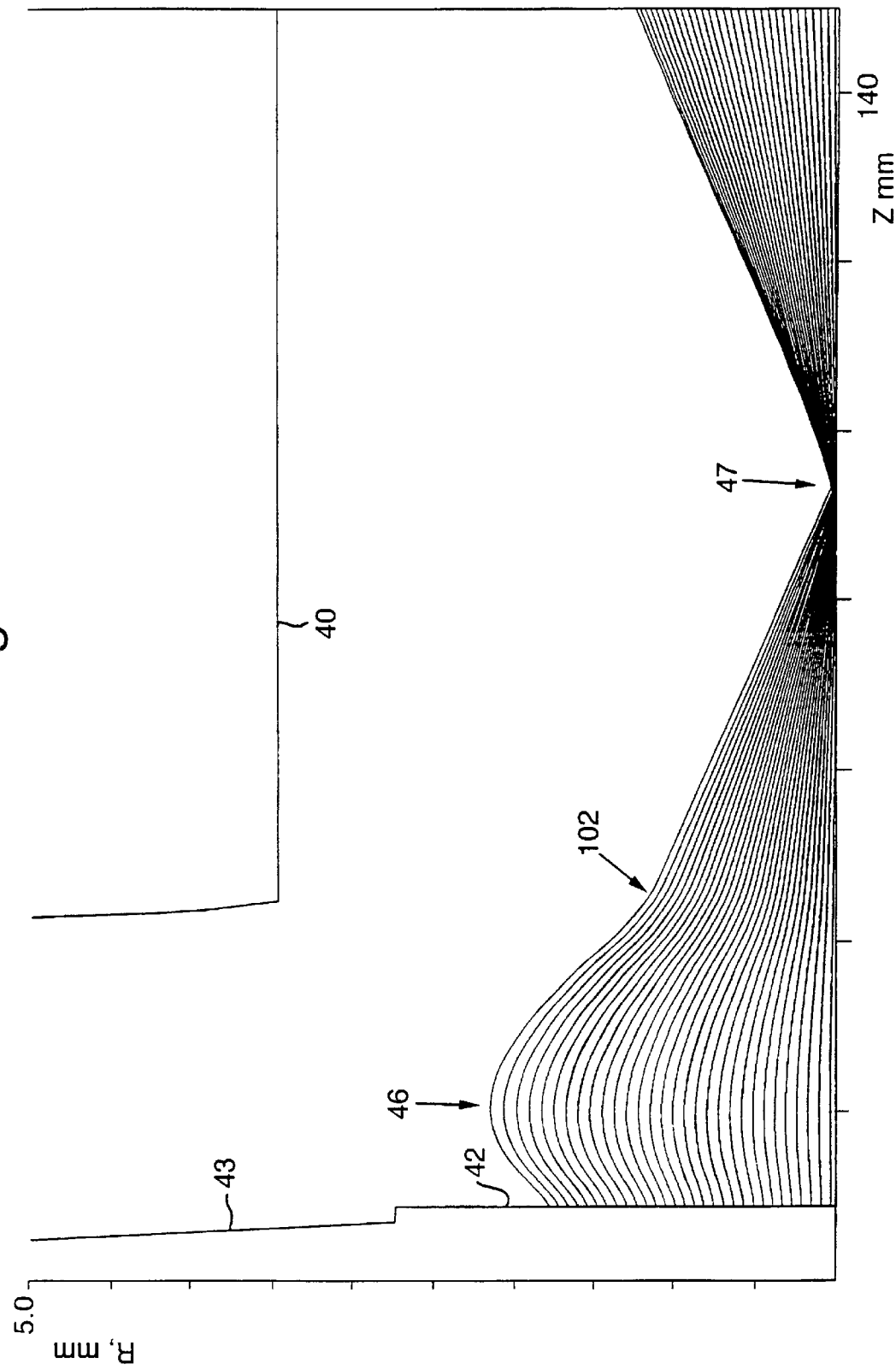
FIG. 16 illustrates electron trajectories for a beam current of 3 mA for the electron beam gun shown in FIG. 15.
Figure 17:
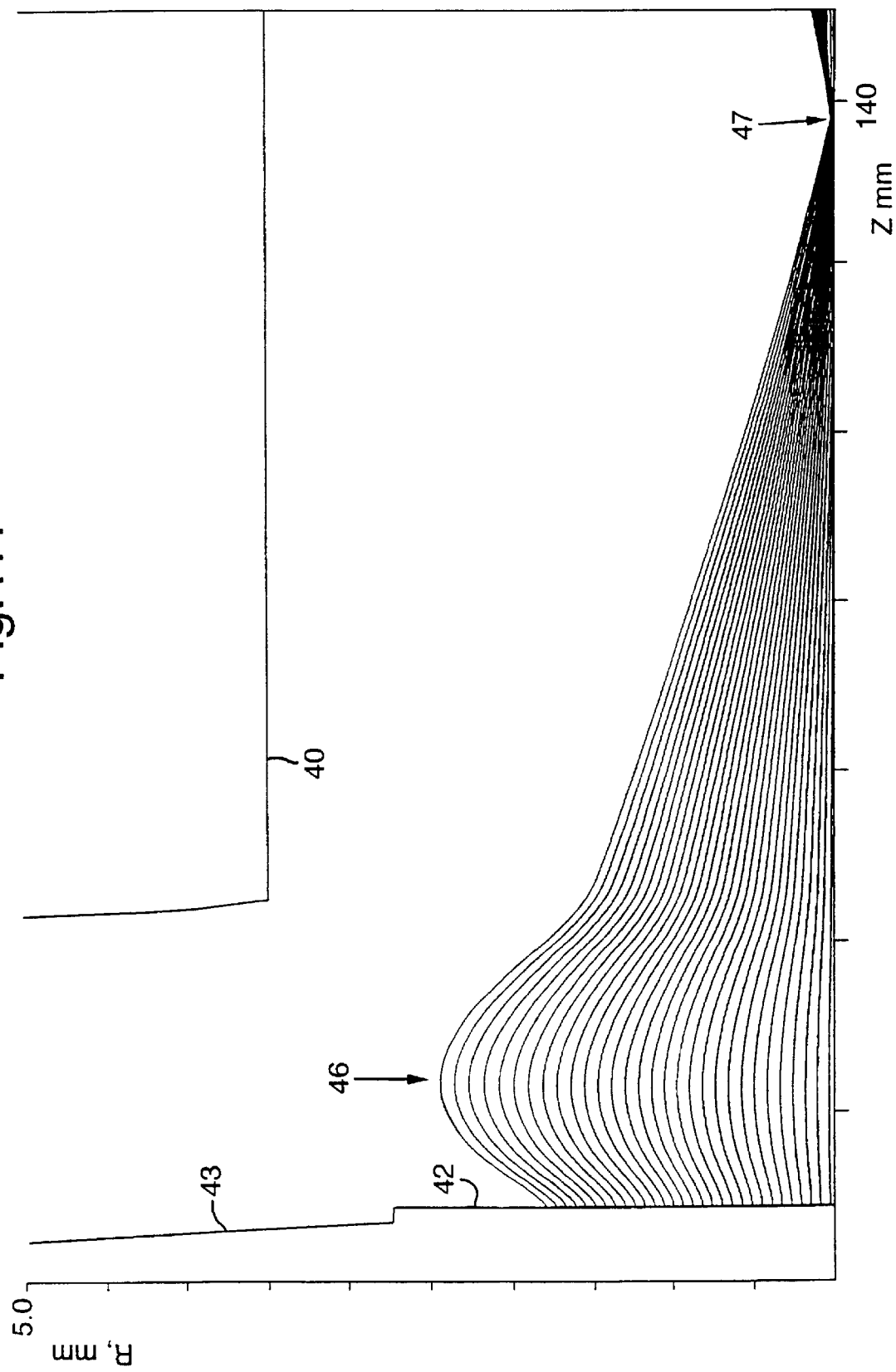
FIGS. 17 to 19 are views similar to FIG. 16 but for beam currents of 166, 225 and 358 mA respectively.
Figure 18:
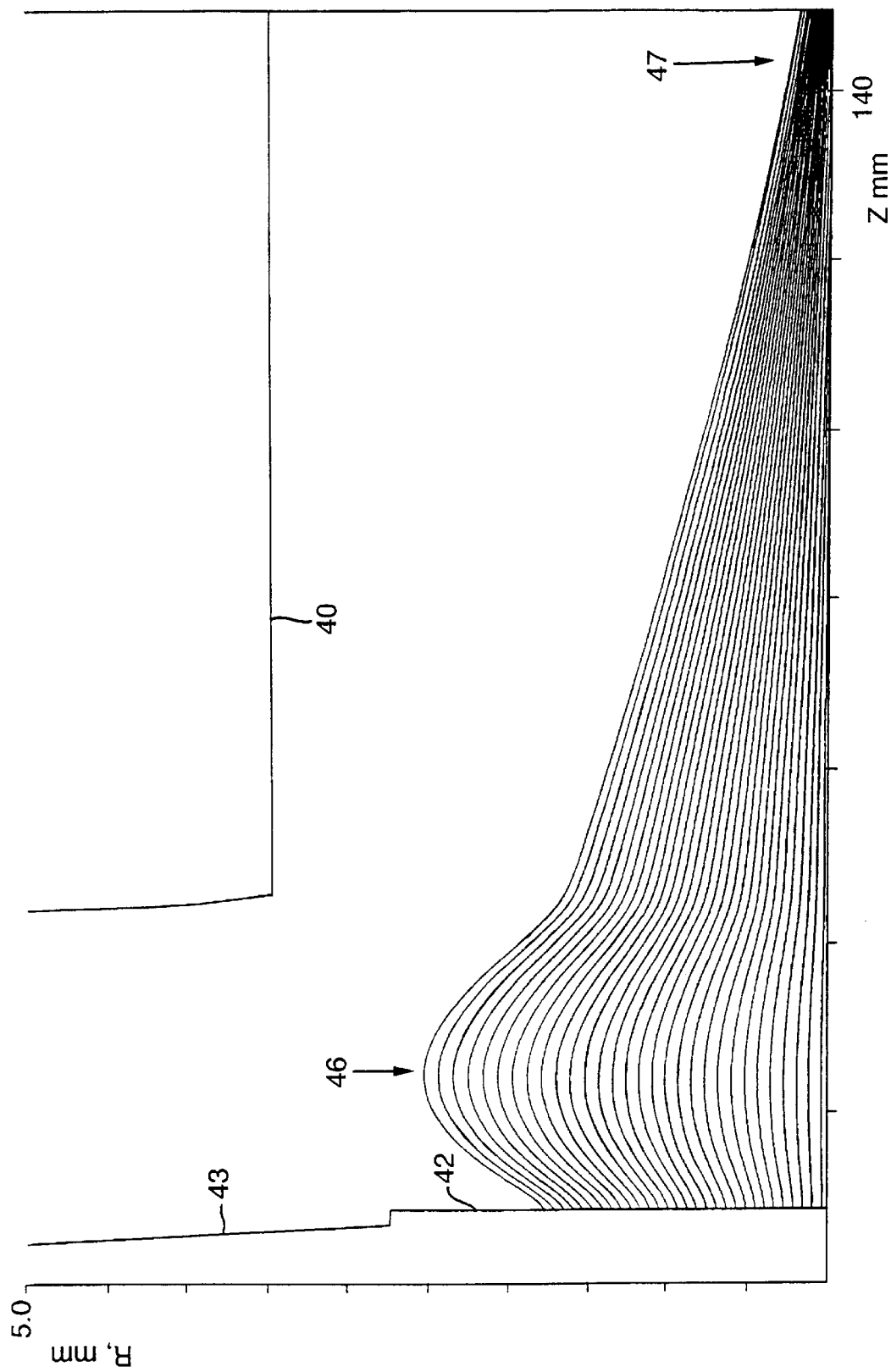
Figure 19:
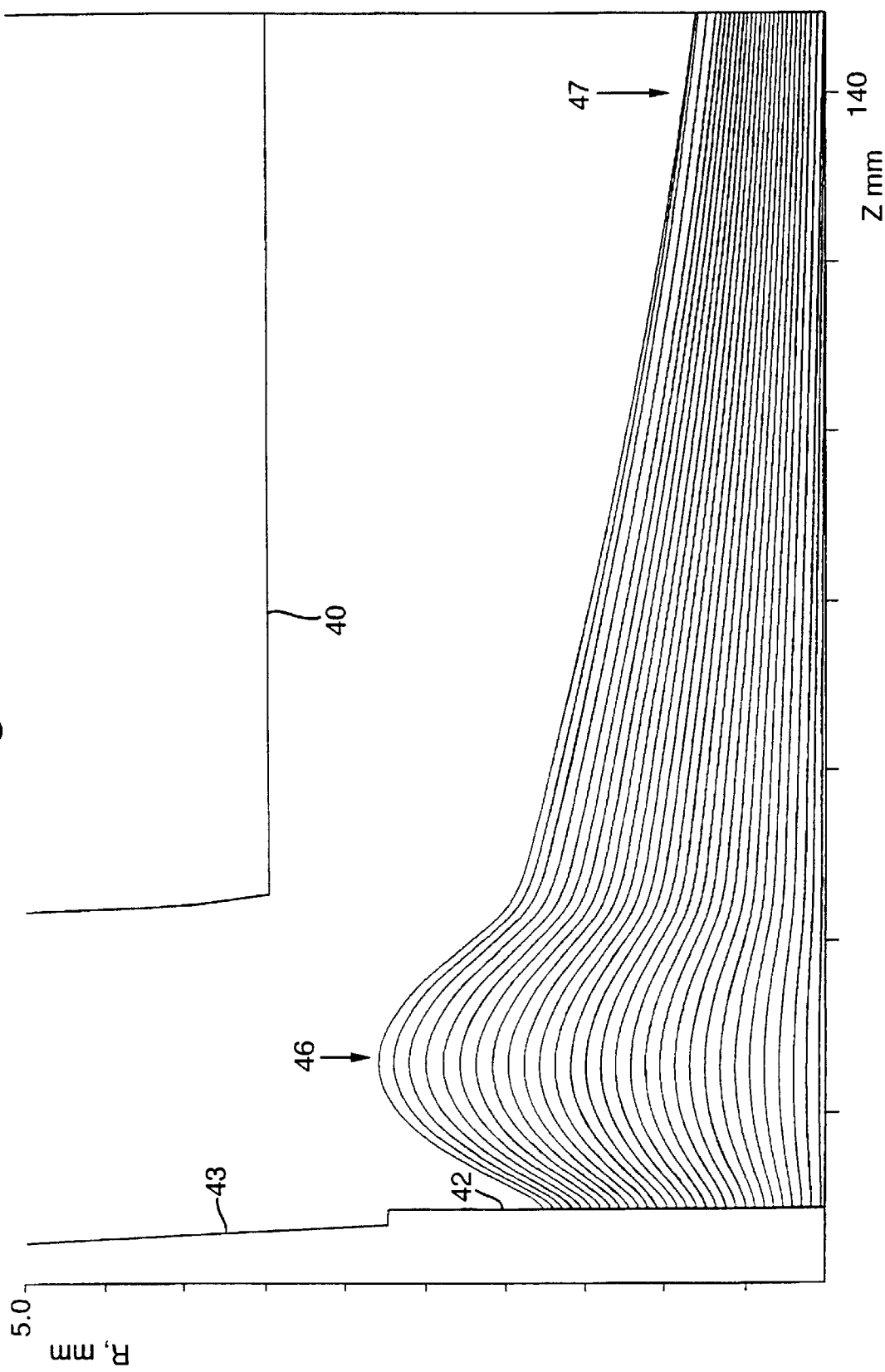

One preferred form of the electrodes is shown in FIG. 15. This consists of a long narrowing anode 40 (having a length in the range 70–90 mm) with multi-bore constrictions and a deeply recessed cathode shield 41 (having a depth in the range 30–40 mm). A cathode emitter 42 is mounted on a hollow conical support 43 and sits in a well 44 in the cathode shield. As shown in more detail in FIG. 15, a filament 45 is located behind the cathode 42. This particular electrode form produces the electron beam as shown in the finite element computer analysis shown in FIGS. 16 to 19 for beam current levels of 3 mA, 166 mA, 225 mA and 358 mA, respectively for an accelerating voltage of 175 kV. At low current (3 mA), FIG. 16, in the absence of appreciable space charge a small but distinct swell 46 is created on the beam 102 by the divergent lens effect created by the protruding cathode 42 mounted in the recess 44 at the centre of the cathode shield 41. The primary cross-over 47 is very well defined, and the electron trajectories are focused almost to a point from which they emerge almost radially. As beam current is increased (166 mA, FIG. 17; 225 mA, FIG. 18; 358 mA, FIG. 19), the swell on the beam progressively increases providing an apparently larger and larger source from which the beam can be refocused. Some spreading and axial movement of the beam is sustained but even at 358 mA a distinct waist 47 (FIG. 19) on the beam is maintained providing a subsequent divergent beam beyond the anode which can be readily refocused to a very small diameter beam for passage through fine bore nozzles.

Figure 20:
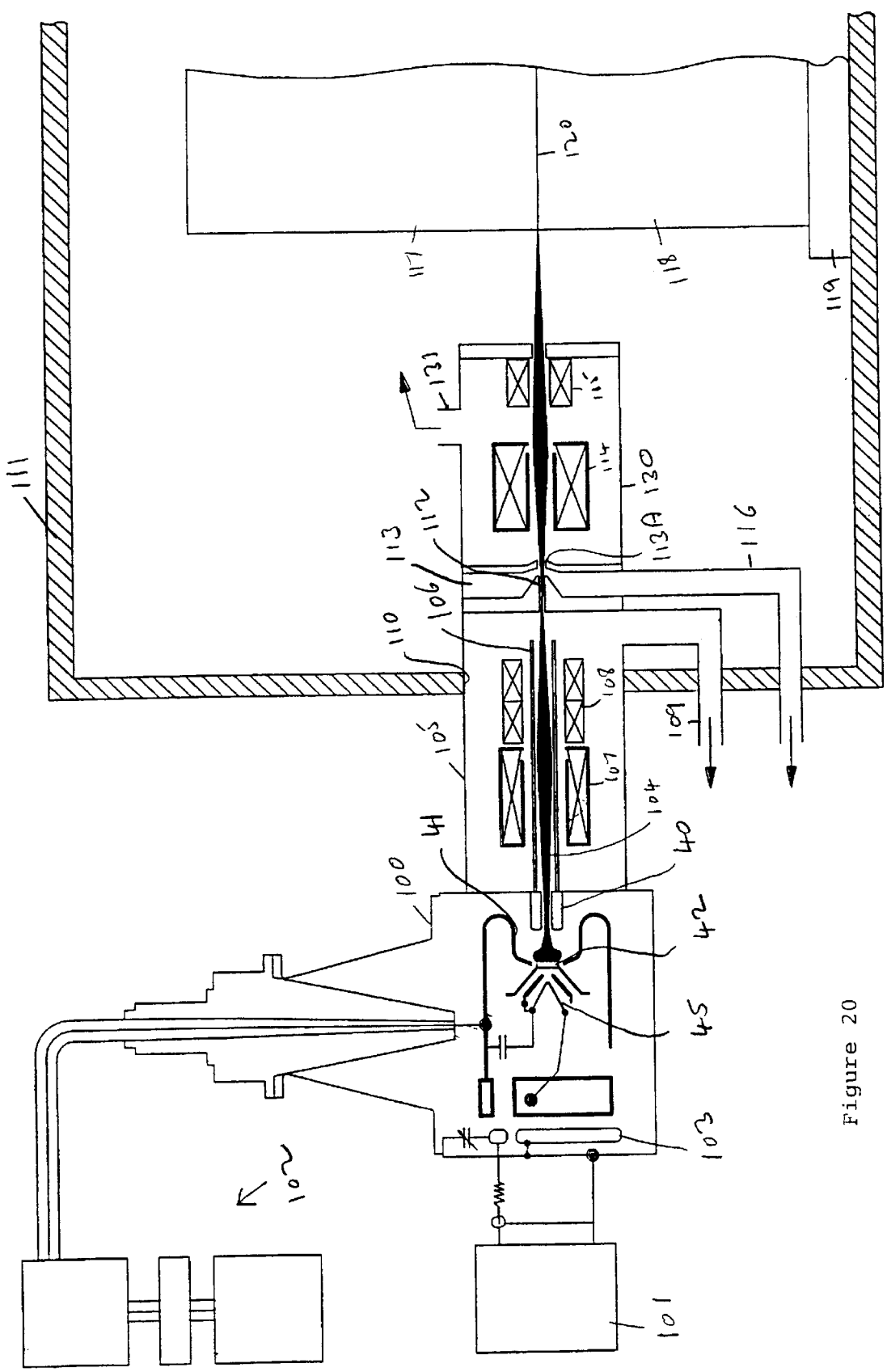
FIG. 20 is a schematic view, partly in section, of welding apparatus incorporating an example of an electron beam gun according to the invention.

An example of welding equipment incorporating the apparatus shown in FIG. 15 is illustrated in FIG. 20. The electron beam gun of FIG. 15 is located in an evacuated housing 100. A DC supply 102 is coupled to the cathode shield 41 and cathode 42 while an RF supply 101 is coupled via an inductor 103 through the filament 45. The filament 45 is heated and emits electrons which are accelerated towards the cathode 42 which generates an electron beam 104 which passes out of the vacuum chamber 100 after having passed through the anode 40, into a chamber 105 held at a pressure higher than that within the chamber 100. The electron beam 104 is confined within a guide tube 106 extending through the chamber 105, the guide tube 106 being surrounded by a focusing coil 107 and a double set of alignment coils 108. The pressure within the chamber 105 is controlled by a pump (not shown) coupled with the chamber via a tube 109. The chamber 105 extends through an aperture 110 in a wall of a welding chamber 111. The end of the chamber 105 remote from the anode 40 is formed as a nozzle 112 through which the electron beam 104 is focused so as to enter a further chamber 113 held at a pressure higher than the pressure within the chamber 105 and evacuated through a tube 116 connected to a further pump (not shown). The chamber 113 includes a nozzle 113A, aligned with the nozzle 112, communicating with a further chamber 130 which includes a further focusing coil 114 and beam deflection coils 115. The chamber 130 is vented to the chamber 111 through an aperture 131. A pair of workpieces to be welded, such as steel tubes 117,118, are mounted on a support 119 within the chamber 111 and with a joint line 120 aligned with the beam 104 which is focused onto the joint line. In this case, the support 119 will rotate about its axis so as to allow the joint line 120 to traverse the electron beam 104. In other arrangements (not shown), the support 119 may be kept stationary and the chamber and gun rotated.

One of the drawbacks of the arrangement shown in FIG. 20 is that separate connections must be made from each pump to the respective chambers 105,113 with the need for the respective pipes 109,116 to extend through the wall of the chamber 111.

Figure 21:
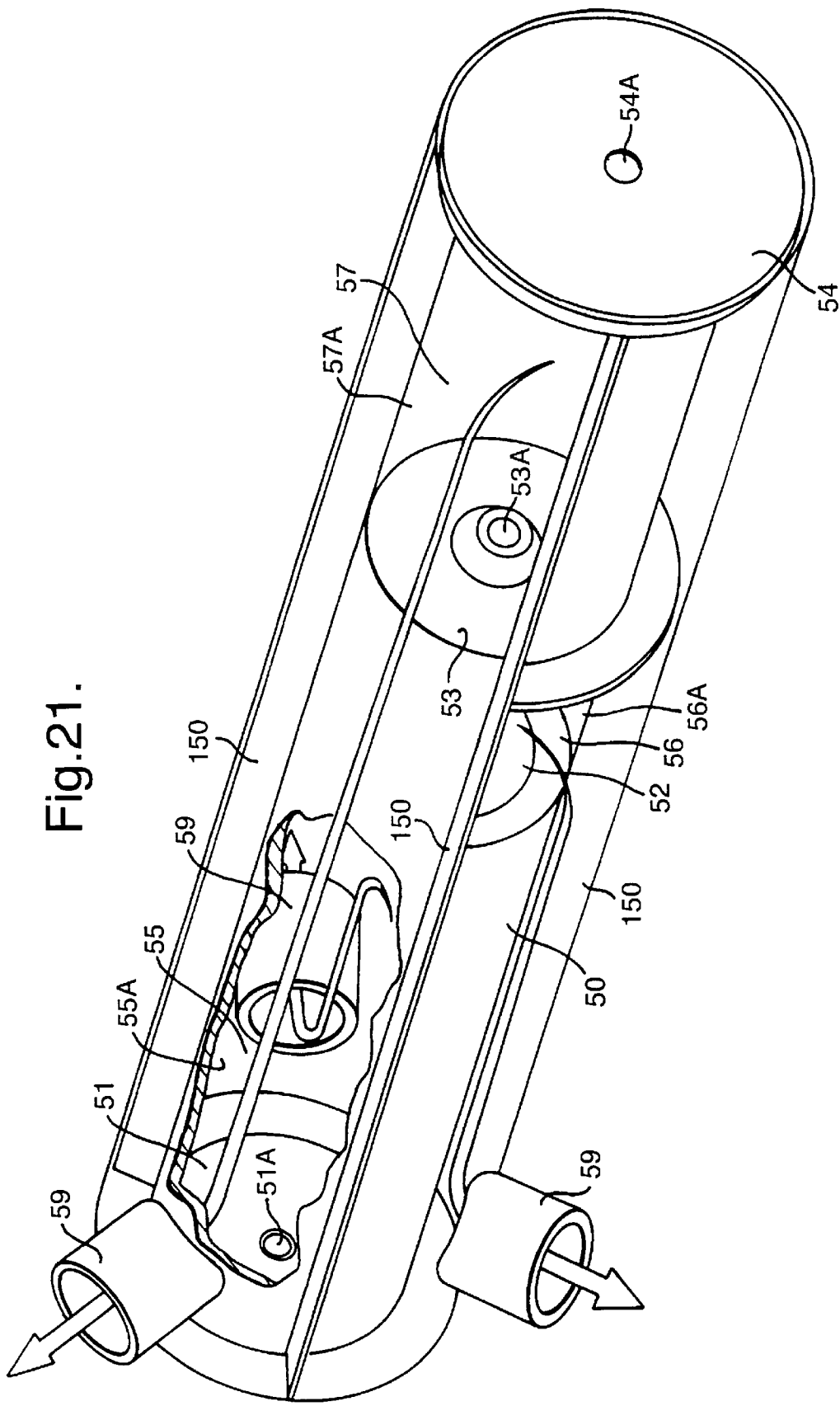
FIG. 21 illustrates an example of a novel arrangement of evacuated chambers.

In FIG. 21, a new type of chamber arrangement is shown in partly cut-away form. A cylindrical tube 50 is provided along which are positioned four walls 51–54 defining respective chambers 55–57. Each wall 51–54 includes a centrally located nozzle 51A–54A (the nozzle 52A not being visible in FIG. 21). The nozzles are aligned so that an electron beam can pass through them. A set of three elongate separators 150 are mounted on the outside of the tube 50 and when the assembly shown in FIG. 21 is located within a cylindrical outer tube engaging the separators 150, respective air passages are defined between each pair of separators 150 and the outer tube.

Each chamber 55–57 communicates with a respective air passage via a cut-away section 55A–57A of the tube 50. Each of the air passages, communicates with respective evacuation pumps through conduits 59.

With this arrangement, it is possible to locate the conduits 59 at one end of the assembly, each pump being connected with a respective conduit 59 and the corresponding chamber 55–57.

Figure 22:
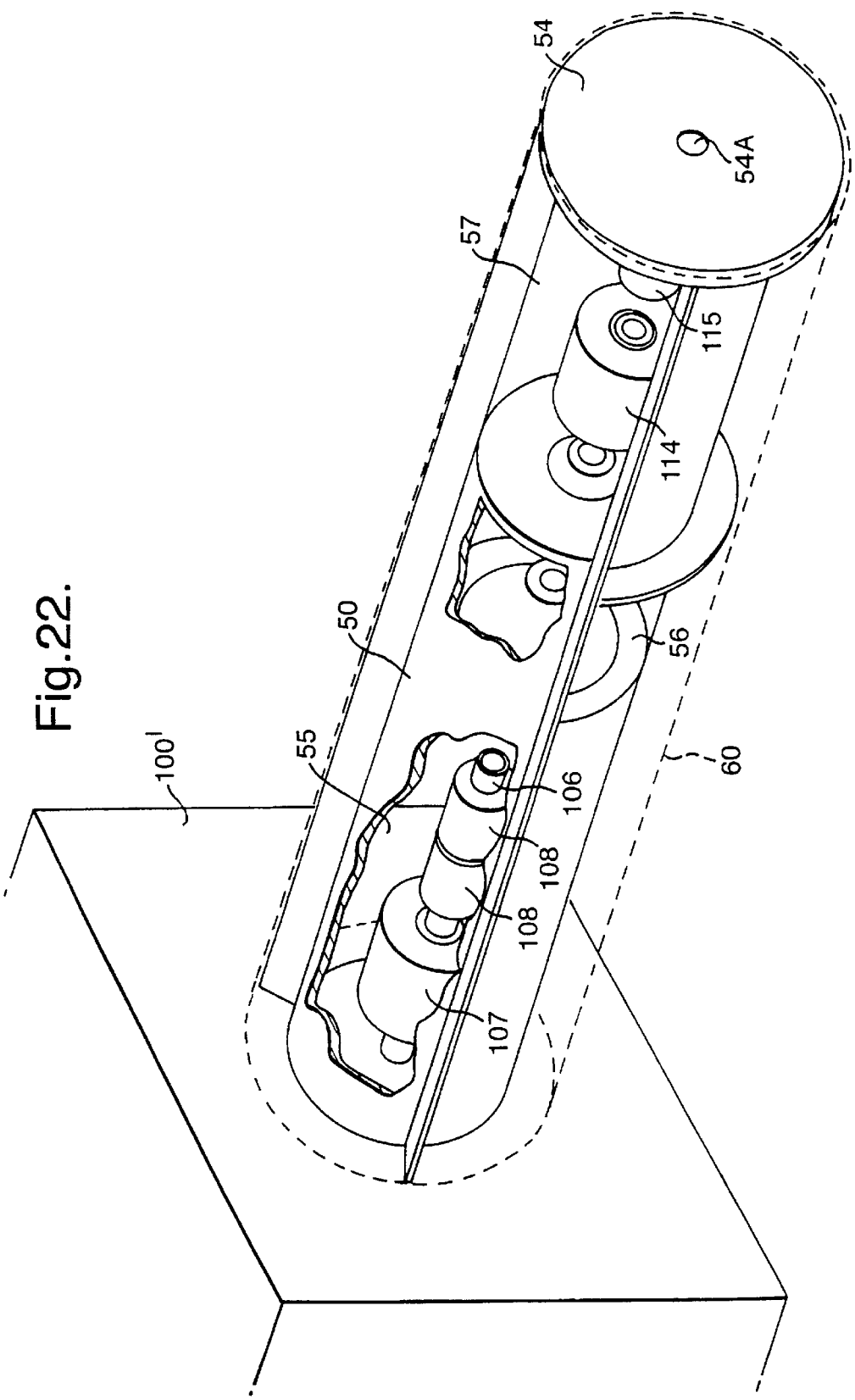
FIG. 22 illustrates the electron beam gun of FIG. 20 associated with the arrangement of evacuated chambers shown in FIG. 21.

FIG. 22 illustrates the welding apparatus of FIG. 20 but when used with a chamber arrangement of the type shown in FIG. 21. The electron beam generator is shown schematically at 100' and may have a similar construction to the generator 100 shown in FIG. 20. As before, an electron beam is confined within a guide tube 106 about which are positioned a focusing coil 107 and alignment coils 108, all within the chamber 55. A further focusing coil 114 and alignment coils 115 are provided in the chamber 57. The outer sleeve 60 within which the chamber arrangement is mounted is shown in dashed lines in FIG. 22.

Figure 23:
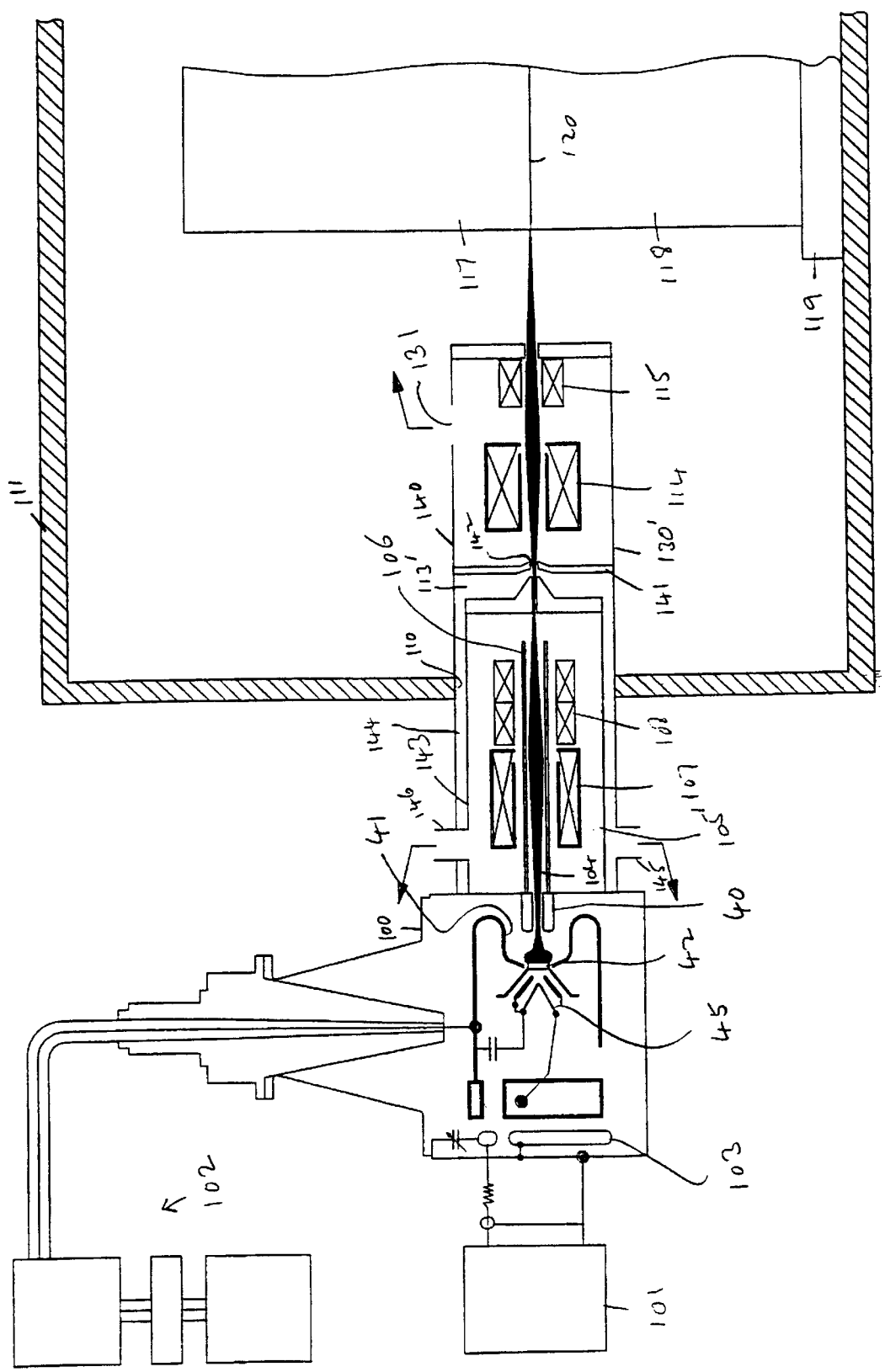
FIG. 23 is a view similar to FIG. 20 but showing a different chamber arrangement.

FIG. 23 illustrates a further example of welding apparatus with a second example of a chamber arrangement. Those components in FIG. 23 which correspond to similar components in FIG. 20 have been given the same reference numbers. In this case, the chamber assembly comprises an outer sleeve 140 which extends through the aperture 110 in a chamber 111. A leading end of the sleeve 140 defines the chamber 130' within which the focusing coil 114 and alignment coils 115 are located. A wall 141 extends across the full cross-section of the sleeve 140 and defines a central nozzle 142 through which the electron beam 104 passes.

An inner, cylindrical sleeve 143 is supported within the rear section of the sleeve 140 to define the chamber 105'. The space 144 between the inner and outer sleeves 143,140 defines the chamber 113' which is evacuated by a pump (not shown) via a passage 145. The chamber 105' communicates with the pump (not shown) via a passage 146 extending through the sleeve 140.

It will be noted in particular that both passages 145,146 are located outside the chamber 111 thus making it much easier to connect to pumps and thus avoiding the complexity of providing further passages through the wall of the chamber 111.

Figure 24:
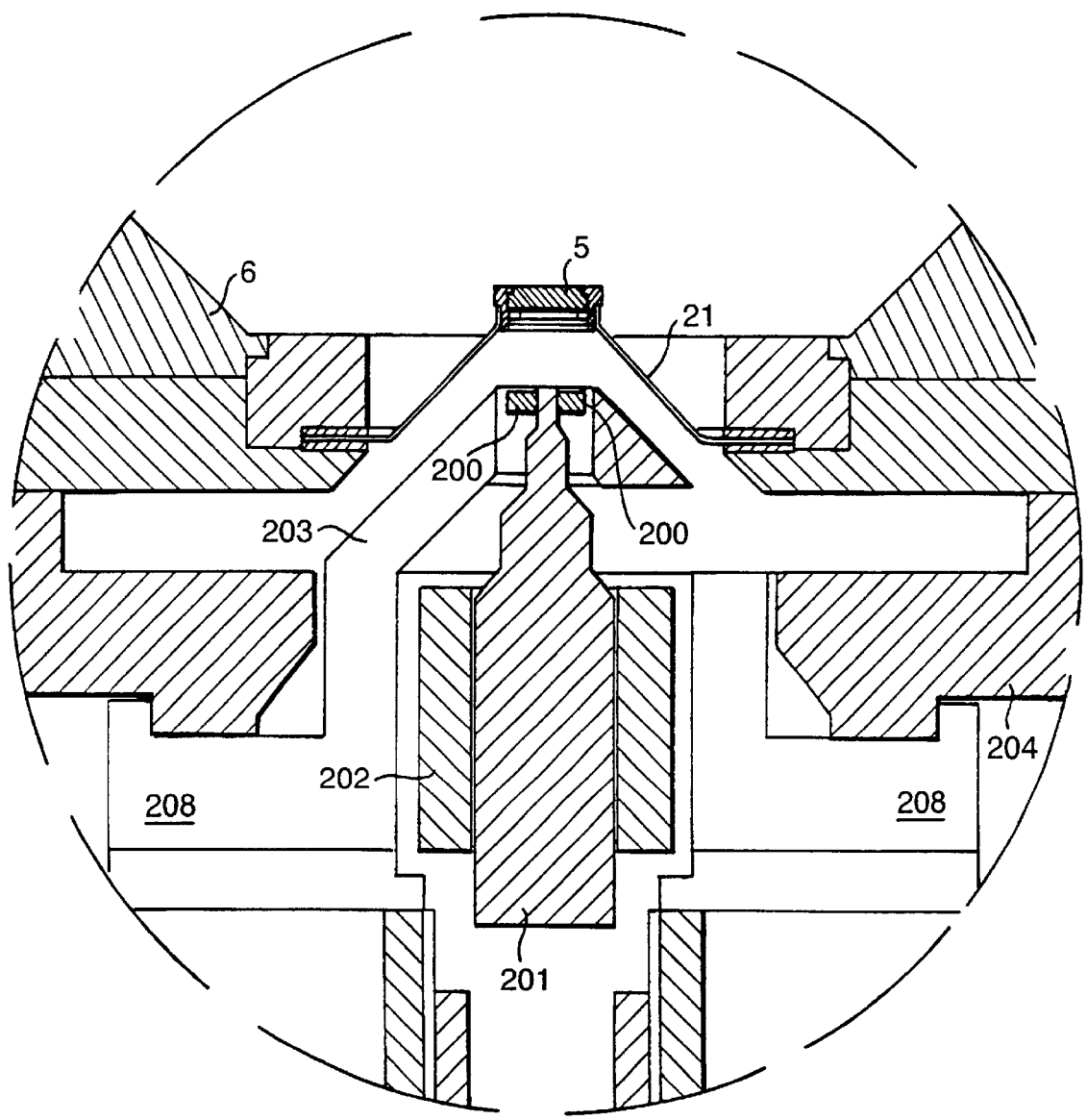
FIG. 24 is a view similar to FIG. 5 but illustrating an alternative arrangement for generating primary electrons.
Figure 25:
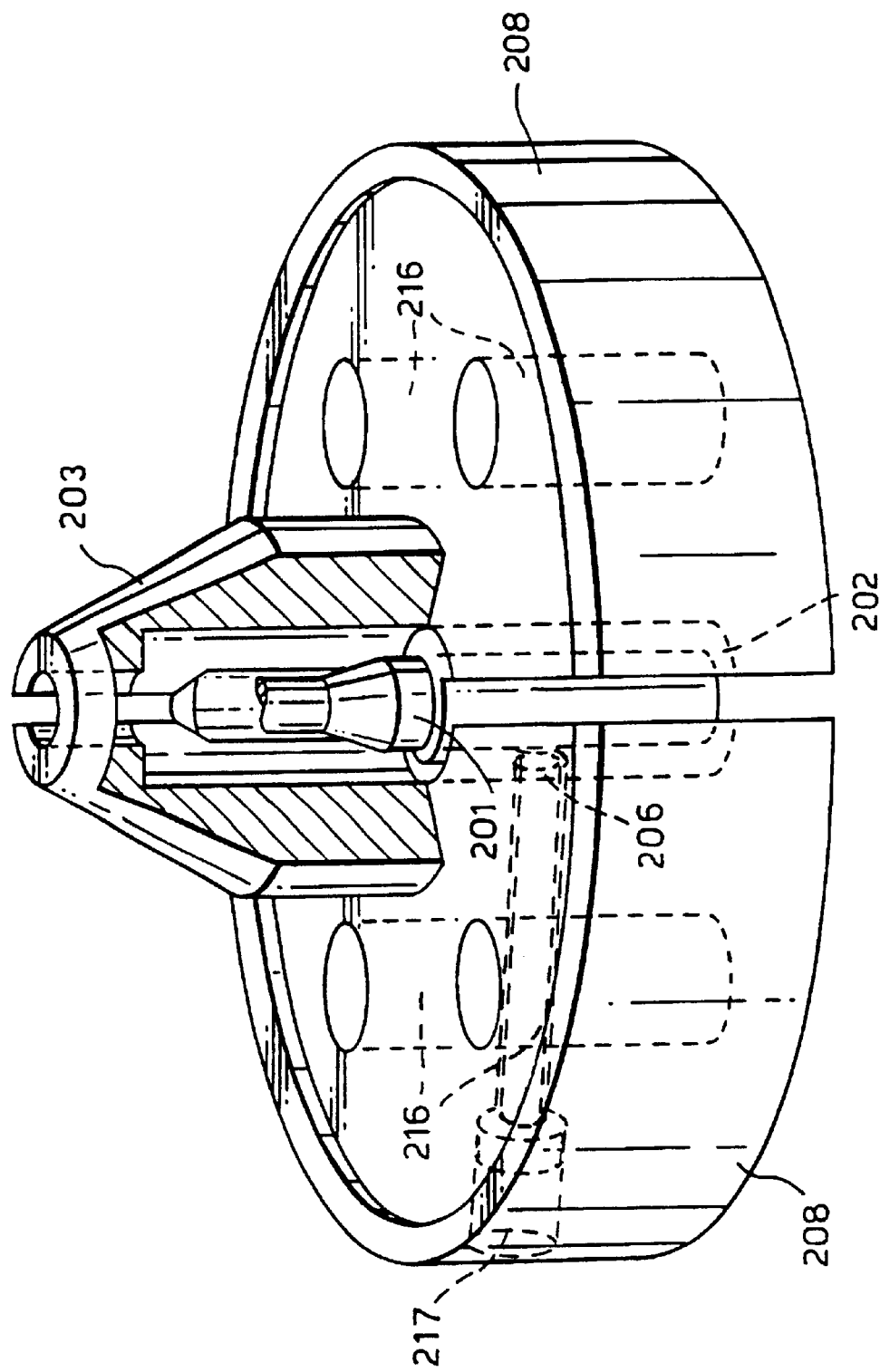
FIG. 25 is a cut-away perspective view of the arrangement shown in FIG. 24; and, FIG. 26 is a circuit diagram illustrating a circuit for use with the arrangement shown in FIGS. 24 and 25.
Figure 26:
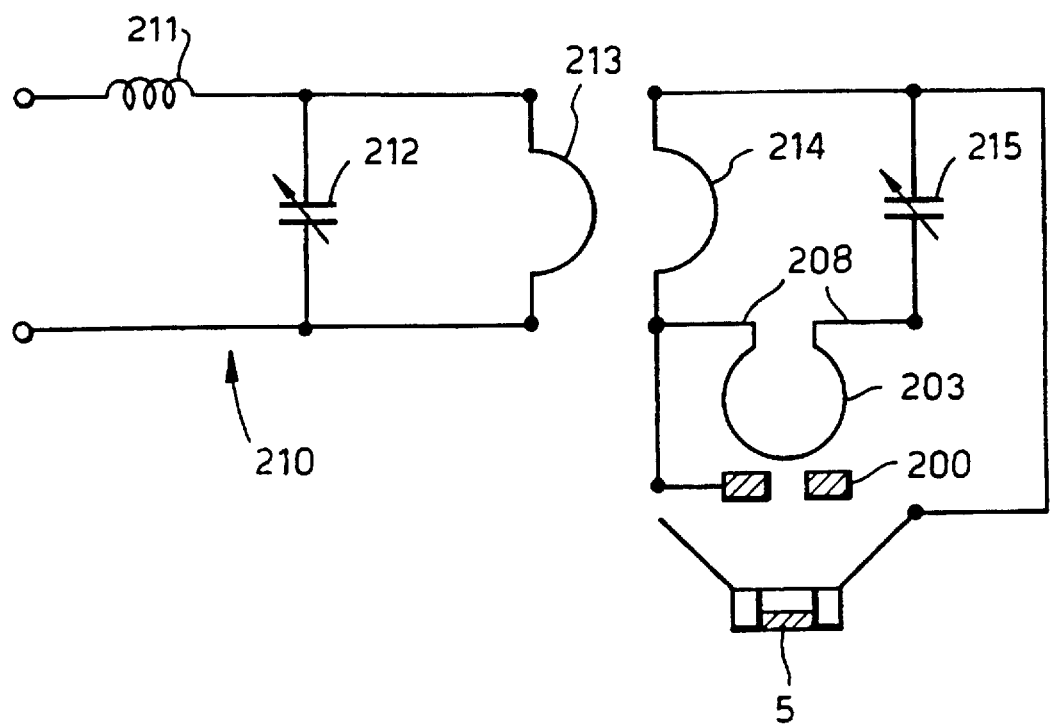

In all the examples described so far, a filament (for example the filament 45 in FIG. 23) has been used to generate primary electrons which bombard the cathode which in turn generates secondary electrons which form the electron beam. In many applications this is satisfactory but for certain applications such as electron beam welding where the electron beam must be maintained for a considerable length of time, the life of the filament is unduly short. In a preferred approach, therefore, the filament is replaced by an inductively heated primary emitter. This is illustrated in FIGS. 24–26. As before, a primary cathode 5 is mounted on a conical support 21 (as in the FIG. 5 example). Spaced behind the cathode 5 is a primary emitter disc 200 which may be made of any suitable heat conductive ceramic such as Lanthanum Hexaboride or refractive metal such as tungsten or tantalum. This disc 200 is supported on a pin 201 which in turn is held in position by a pin holder 202 screwed at 206 into a split coupling loop base 208 by screw 217. A grub screw (not shown) is provided inside screw 217 which locks the pin 201 into the copper member 202.

The primary emitter 200 may be mounted on the pin 201 in any convenient manner but since the conical support 21 can focus reverse emitted electrons from the cathode 5 onto the emitter 200, it is preferable to secure the emitter 200 by a central rivet which will receive the focused beam and thus avoid damaging the primary emitter.

In order to heat the primary emitter 200, an inductive coupling loop 203 is provided which surrounds the primary emitter and is connected into an electrical circuit as shown in FIG. 26. The inductive coupling loop 203 is supported by a ceramic insulator 204.

The inductive coupling loop 203 is connected to the split coupling loop base 208. Conveniently, the inductive coupling loop 203 and split coupling loop base 208 are machined from a single metal block, for example copper.

As shown in FIG. 26, the circuit for powering the assembly shown in FIGS. 24 and 25 is generally as described in EP-A-0627121 and includes a matching circuit 210 connected to an RF amplifier (not shown) and including an inductor 211 and adjustable capacitor 212 linked to a primary winding (aerial) 213. The aerial 213 induces a voltage in a secondary winding 214 coupled to a resonant capacitor 215 and, via the split coupling loop base 208, to the inductive coupling loop 203. Secondary winding 214 is also connected to the primary emitter 200 and to the main cathode 5. The voltage generated across the inductor 214 and capacitor 215 is used to accelerate electrons from the primary emitter 200 to the cathode 5 when the cathode is positive with respect to the primary emitter.

FIG. 25 illustrates a number of threaded holes 216 which are for accommodating components of the circuit shown in FIG. 26 such as the secondary winding 214 and resonant capacitor 215.

It has been found that the use of an inductively heated primary emitter results in a considerably increased life time (as compared with a conventional filament) making this arrangement particularly suitable for electron beam welding.

What is claimed is:

1. A charged particle emitting assembly comprising an emitter member for emitting charged particles of one polarity; a tubular shield electrode circumferentially surrounding the emitter member and held in use at the same polarity as the charged particles; and a tubular accelerating electrode positioned substantially coaxially with the shield electrode and held in use at the opposite polarity to the shield electrode, the arrangement being such that charged particles from the emitter member initially spread laterally outwardly and then are focused into a beam which passes through the tubular accelerating electrode.

2. An assembly according to claim 1, wherein the electrodes are arranged to generate an electrostatic field which initially causes divergence of the charged particle beam in a direction from the emitter member towards the tubular electrode.

3. An assembly according to claim 2, wherein the emitter is mounted to a central portion of the shield electrode, projecting from a base of the shield.

4. An assembly according to claim 3, wherein the projecting, central portion tapers outwardly towards the base of the shield electrode.

5. An assembly according to claim 1, further comprising means for causing the emitter to emit the charged particles.

6. An assembly according to claim 5, wherein the means for causing the emitter to emit charged particles comprises a source of second charged particles arranged to bombard the emitter.

7. An assembly according to claim 6, wherein the charged particles emitted by the source comprise electrons.

8. An assembly according to claim 1, wherein the charged particles emitted by the emitter comprise electrons.

9. An assembly according to claim 6, wherein the source of second charged particles includes an inductively heated auxiliary emitter.

10. An assembly according to claim 1, wherein the shield electrode has a substantially cylindrical side.

11. An assembly according to claim 1, wherein the tubular electrode terminates adjacent a plane defined by the edge of the shield electrode.

12. An assembly according to claim 1, wherein the emitter comprises an emitter member mounted in an aperture of a support member to which it is electrically connected, the emitter member having a lower work function than the support member whereby at a working temperature, the emitter member emits charged particles from an exposed surface.

13. A charged particle emitter comprising an emitter member mounted in an aperture of a support member to which it is electrically connected, the emitter member having a lower work function than the support member whereby at a working temperature, the emitter member emits charged particles from an exposed surface characterised in that the exposed surface of the emitter member is substantially flush with or set back from an outwardly facing surface of the support member surrounding the aperture.

14. An emitter according to claim 13, wherein the emitter member is a close fit in the aperture of the support member.

15. An emitter according to claim 13, wherein part of the support member and part of the emitter member are correspondingly tapered.

16. An emitter according to claim 15, wherein the part of the support member and emitter member taper inwardly towards the exposed surface of the emitter member.

17. An emitter according to claim 13, wherein the emitter member is secured to the support member by a clip which engages each member.

18. An emitter according to claim 17, wherein the clip is received in a groove in the support member.

19. An emitter according to claim 13, wherein the exposed surface of the emitter member and the outwardly facing surface of the support member define a common plane.

20. An emitter according to claim 19, wherein the exposed surface of the emitter member and the outwardly facing surface of the support member define one of a convex, conical, concave or re-entrant form.

21. An emitter according to claim 13, wherein the support member includes a cone shaped section.

22. An emitter according to claim 13, wherein the emitter member emits electrons when heated to the working temperature.

23. An emitter according to claim 13, wherein the emitter member comprises lanthanum hexaboride.

24. An emitter according to claim 13, wherein the support member comprises tantalum.

25. An assembly according to at least claim 12, wherein the emitter comprises a charged particle emitter comprising an emitter member mounted in an aperture of a support member to which it is electrically connected, the emitter member having a lower work function than the support member whereby at a working temperature, the emitter member emits charged particles from an exposed surface characterised in that the exposed surface of the emitter member is substantially flush with or set back from an outwardly facing surface of the support member surrounding the aperture.

26. Welding apparatus including a charged particle emitting assembly according to claim 1; a workpiece support for supporting a workpiece exposed to the charged particle beam; and means for causing relative movement between the charged particle beam and the workpiece support.

27. A charged particle beam column assembly for mounting to an evacuated charged particle beam source chamber, the assembly having a sequence of controlled pressure chambers, each having inlet and outlet apertures through which a charged particle beam can pass and an evacuation port for connection to a pump to enable the pressure in the chamber to be controlled, whereby the pressure in successive chambers increases in use characterised in that an evacuation port is connected to a downstream chamber via a conduit which extends within the assembly past at least one upstream chamber.

28. An assembly according to claim 27, wherein the chambers are defined by nested tubes, each conduit being formed by the tubular wall of a tube defining the chamber to which the conduit is connected and the tubular wall of the next upstream chamber.

29. An assembly according to claim 28, wherein the nested tubes are substantially coaxial.

30. An assembly according to claim 27, wherein the chambers are defined by a set of tubular sections located within an outer tube, each tubular section having a radially outwardly facing opening, the radially outwardly facing opening of each chamber being circumferentially offset from the radially outwardly facing openings of all the other chambers; and a set of axially extending dividing walls positioned between the tubular sections and the outer tube to form the respective conduits, each conduit connecting the radially outwardly facing opening of a chamber with a corresponding evacuation port.

31. An assembly according to claim 30, wherein the tubular sections have substantially the same diameter.

32. An assembly according to claim 28, wherein the nested tubes or the tubular sections are substantially cylindrical.

33. An assembly according to claim 27, wherein the inlet aperture of one chamber is defined by the outlet aperture of the next adjacent upstream chamber.

34. An assembly according to claim 27, wherein the inlet and outlet apertures define a rectilinear path for the beam.

35. A charged particle beam assembly comprising an evacuated charged particle beam source chamber coupled to an assembly according to claim 27.

36. An assembly according to claim 35, wherein the pressure of the chamber furthest from the charged particle beam source chamber is held below atmospheric pressure.

37. A charged particle beam assembly according to claim 35, wherein the evacuated charged particle beam source chamber includes a source comprising a charged particle emitting assembly comprising an emitter member for emitting charged particles of one polarity; a tubular shield electrode circumferentially surrounding the emitter member and held in use at the same polarity as the charged particles; and a tubular accelerating electrode positioned substantially coaxially with the shield electrode and held in use at the opposite polarity to the shield electrode, the arrangement being such that charged particles from the emitter member initially spread laterally outwardly and then are focused into a beam which passes through the tubular accelerating electrode.

* * * * *